(12) United States Patent
Vielemeyer

(10) Patent No.: US 8,350,273 B2
(45) Date of Patent: Jan. 8, 2013

(54) SEMICONDUCTOR STRUCTURE AND A METHOD OF FORMING THE SAME

(75) Inventor: Martin Henning Albrecht Vielemeyer, Villach (AT)

(73) Assignee: Infineon Technologies AG, Neubiberg (DE)

(*) Notice: Subject to any disclaimer, the term of this patent is extended or adjusted under 35 U.S.C. 154(b) by 532 days.

(21) Appl. No.: 12/551,021

(22) Filed: Aug. 31, 2009

(65) Prior Publication Data
US 2011/0049681 A1 Mar. 3, 2011

(51) Int. Cl.
*H01L 29/04* (2006.01)

(52) U.S. Cl. ... 257/78; 257/627; 257/628; 257/E29.004; 257/E21.09

(58) Field of Classification Search ............ 257/78, 257/627–628
See application file for complete search history.

(56) References Cited

U.S. PATENT DOCUMENTS

| | | | | |
|---|---|---|---|---|
| 2002/0069816 | A1* | 6/2002 | Gehrke et al. | 117/84 |
| 2002/0074561 | A1* | 6/2002 | Sawaki et al. | 257/103 |
| 2003/0006406 | A1* | 1/2003 | Chikyow et al. | 257/12 |
| 2005/0161702 | A1* | 7/2005 | Linthicum et al. | 257/183 |
| 2006/0169987 | A1* | 8/2006 | Miura et al. | 257/79 |
| 2006/0292833 | A1* | 12/2006 | Matsushita | 438/462 |
| 2007/0205407 | A1* | 9/2007 | Matsuo et al. | 257/13 |
| 2009/0072262 | A1* | 3/2009 | Iza et al. | 257/98 |
| 2009/0261363 | A1* | 10/2009 | Chen et al. | 257/95 |
| 2010/0172387 | A1* | 7/2010 | Ueda et al. | 372/44.011 |
| 2010/0212729 | A1* | 8/2010 | Hsu | 136/255 |

OTHER PUBLICATIONS

Sawaki, N., et al., "Growth and properties of semi-polar GaN on a patterned silicon substrate," Journal of Crystal Growth, Proceedings of the 2nd International Symposium on Growth of III Nitrides, vol. 311, Issue 10, May 1, 2009, pp. 2867-2874, Elsevier B.V.

Furtmayr, F., et al., "Nucleation and growth of GaN nanorods on Si (111) surface by plasma-assisted molecular beam epitaxy—The influence of Si- and Mg-doping," Journal of Applied Physics, vol. 104, 2008, 7 pages, American Institute of Physics.

* cited by examiner

*Primary Examiner* — A. Sefer
(74) *Attorney, Agent, or Firm* — Slater & Matsil, L.L.P.

(57) ABSTRACT

Some embodiments show a semiconductor structure including a substrate with a {100} crystal surface plane which includes a plurality of adjacent structured regions at a top side of the substrate. The plurality of adjacent structured regions includes adjacent substrate surfaces with {111} crystal planes and a III-V semiconductor material layer above the top side of the substrate. A semiconductor device region includes at least one semiconductor device structure. The semiconductor device region is arranged above the plurality of adjacent structured regions at the top side of the substrate.

23 Claims, 25 Drawing Sheets

SEMICONDUCTOR STRUCTURE AND A METHOD OF FORMING THE SAME

TECHNICAL FIELD

Embodiments relate to a semiconductor structure in a III-V semiconductor material layer on top of a substrate.

BACKGROUND

Due to its excellent material properties, gallium nitride and other hetero-structures of the III-V material group are candidates for fabricating semiconductor devices with high performance, for example, with respect to the temperature stability, the operation speed or the breakdown voltage. The III-V semiconductor devices can, for example, be used as power semiconductor devices or in high frequency applications.

A prerequisite for manufacturing III-V semiconductor devices with high performance is, among others, a sufficient quality of the epitaxially grown III-V semiconductor material layers. The growth of, for example, gallium nitride (GaN) on silicon (Si) may often result in low-quality GaN layers, which are not suitable to form semiconductor devices. The low-quality III-V material layers may comprise a high number of defects, e.g., slip lines and other distortions of the grown crystal lattice. The dislocation defects or slip lines may be formed during the epitaxial growth of the crystal. The slip lines may emerge at the silicon substrate. Thereby the slip lines can grow only partially through the epitaxial layer or through the whole epitaxial layer. Such an epitaxial layer with a high number of dislocation defects may be unsuitable for a further processing of a semiconductor device.

SUMMARY OF THE INVENTION

Embodiments relate to a semiconductor structure in a {100} substrate with at least one semiconductor device structure in a semiconductor device region of a III-V semiconductor material layer, wherein the semiconductor device region is arranged above a plurality of adjacent structured regions comprising {111} crystal planes at the top side of the substrate.

DETAILED DESCRIPTION OF ILLUSTRATIVE EMBODIMENTS

Figure 1:
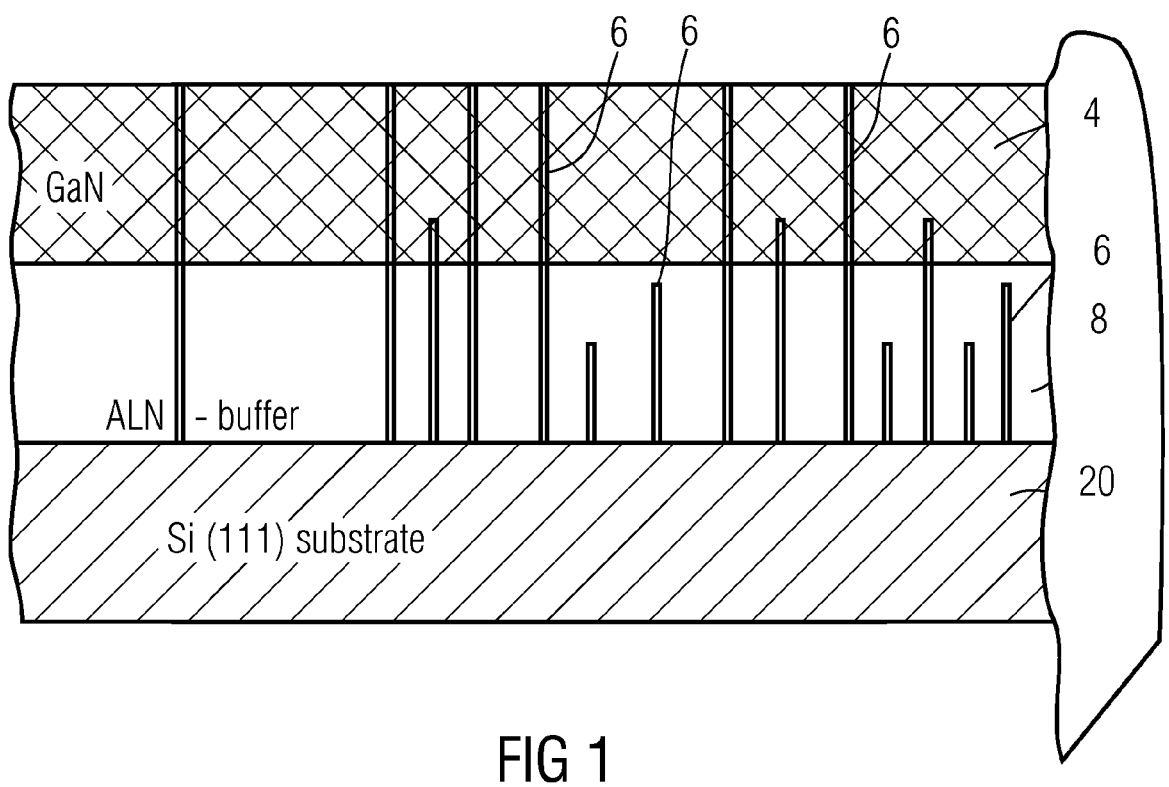
FIG. 1 shows a schematic cross sectional view of a GaN-layer on top of a silicon substrate with an aluminum nitride (AlN) buffer, wherein the GaN-layer comprises a plurality of slip lines.

In FIG. 1, a schematic cross sectional view of a semiconductor structure is shown. The semiconductor structure comprises a silicon substrate 20, an aluminum nitride (AlN) buffer layer 8 and a gallium nitride (GaN) layer 4. The gallium nitride layer 4 comprises a plurality of dislocation defects or slip lines 6. The slip lines 6 typically develop in efforts to epitaxially grow a crystal material on a substrate of a different kind of material. These slip lines 6 may emerge from the substrate 20 during the growth of crystalline nitride, e.g., the AlN buffer layer 8, on the substrate 20. The crystal lattice of the substrate 20 may be different to the crystal lattice of the epitaxial grown III-V material layer 4, e.g., gallium nitride. Due to the crystal lattice mismatch, this means that due to the different crystalline lattice size of the two material types a mechanical stress, tensions or crystal lattice compression strength in the epitaxial grown III-V material layer 4 may occur. The lattice mismatch between the starting substrate 2 and the subsequent layers 8, 4 may create strain, for example, tension or compressive strength during the epitaxial growth that resides in the generation of crystal defects, e.g., slip lines 6, in the semiconductor layers 8, 4. There may be at least one buffer layer 8, for example, an aluminum nitride layer, between the substrate layer 2 and the III-V semiconductor material layer with a crystalline lattice size, which allows a more gentle adaption of the crystalline lattice size of the substrate 2 to the crystalline lattice size of the III-V semiconductor material. A semiconductor structure which comprises two different kinds of materials with different crystal lattice constants can be called hetero-structure.

In FIG. 1, the substrate may be a silicon substrate with {111} crystal surface planes. All crystal lattice planes and lattice directions herein are described by a mathematical description known as a miller index. This allows the specification, investigation and discussion of specific planes and directions of the crystal. As the crystal is a periodic family of equivalent directions and planes, this can easily be described with the miller indices. The location of the different crystal surface planes and the direction within a crystal are described by the miller indices. In particular, a family of lattice planes is determined by three integers l, m and n, the miller indices. They are written (lmn) and denote planes orthogonal to a direction <lmn> on the basis of the reciprocal lattice vectors. The notation {lmn} denotes all planes that are equivalent to (lmn) by the symmetry of the lattice.

The substrate 20 may be a wafer. Wafers are grown from crystal having a regular crystal structure, with silicon having a diamond cubic structure. When cut into wafers, the surface is aligned in one of several relative directions known as crystal orientations or crystal planes. The crystal plane is defined by the miller indices as described above. The most common crystal surface planes for silicon are the {100} or the {111} crystal planes. Gallium nitride can comprise a hexagonal structure, a wurtzite structure, that can be grown on a silicon substrate with {111} crystal surface planes. A silicon substrate with a {111} crystal surface plane comprises also a hexagonal surface. This can be helpful for the GaN growth on the silicon, but nevertheless the lattice mismatch between silicon and gallium nitride is still high.

In order to optimize the growth of the III-V material on the substrate, the mismatch of the crystal lattices should be minimized. This may be achieved by using one or more buffer layers, which comprise a lattice mismatch, which is smaller than a lattice mismatch between the substrate and the III-V semiconductor material.

Dislocation defects 6 may cause a degradation of the device performance of a semiconductor device, such as a transistor or diode, which is formed in III-V semiconductor layer grown on a silicon substrate. This means, that the slip lines 6 make the construction of a semiconductor device and the forming of respective device areas very difficult.

Conventional methods for fabricating gallium nitride layers 4 in a sufficient quality to fabricate semiconductor devices are the so-called epitaxial longitudinal overgrowth (ELOG) and a gallium nitride deposition using a plurality of buffer layers.

Figure 2:
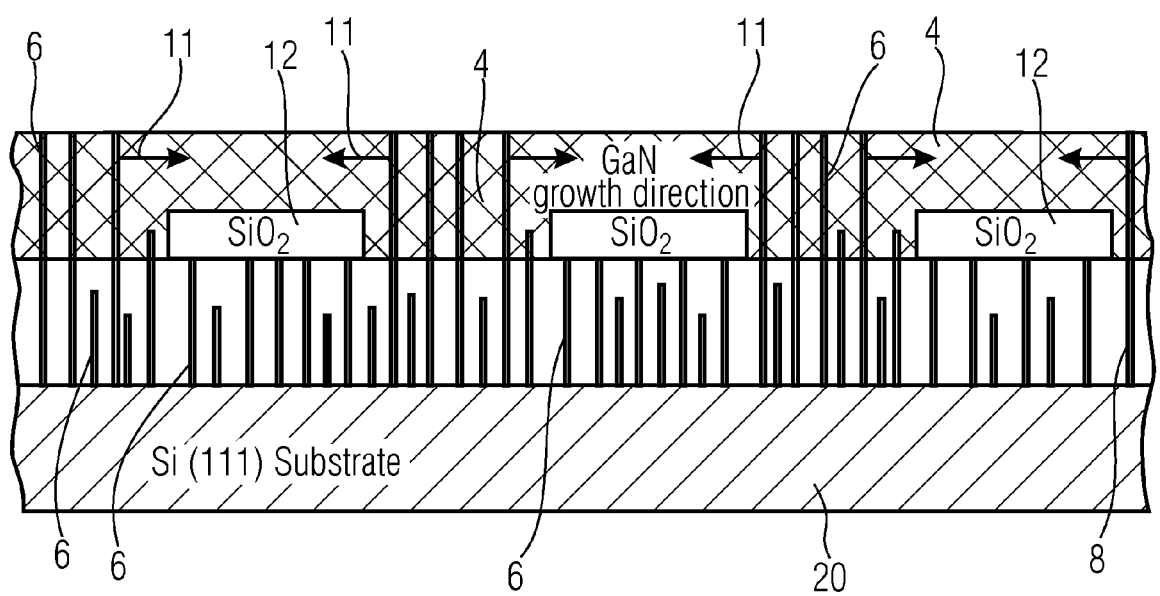
FIG. 2 shows an epitaxial longitudinal overgrowth (ELOG) of silicon oxide structures in order to decrease a slip line density in the GaN-layer.

In FIG. 2, the ELOG method is schematically shown. On top of a silicon substrate 20, one or more buffer layers 8 can be grown. Afterwards masking structures 12, for example, silicon oxide ($SiO_2$) structures, are formed on the buffer layers 8. These silicon oxide structures 12 are similar to a (hard)-mask. In subsequent processing steps, the masking structures 12 are epitaxial overgrown, which is schematically shown by the arrows 11. If the structures 12 are correctly chosen, there are regions above the silicon oxide structures 12 with a lower slip line density compared to the regions which are not covered by the silicon oxide structures 12. In order to achieve a gallium nitride growth with sufficient quality, a Si {111}-substrate can be used.

An alternative conventional method to grow gallium nitride layers with a sufficient quality to form a semiconductor device in the gallium nitride layer is the deposition of a plurality of buffer layers on top of a Si-substrate. For this purpose on top of the silicon substrate, an aluminum nitride buffer may be deposited. The aluminum nitride buffer layer may be a high-temperature AlN-layer. Subsequent layers may comprise different Al(x)Ga(1−x)N layers with a decreasing share of aluminum. According to an embodiment the different Al(x)Ga(1−x)N layers may comprise a continuously decreasing share of aluminum. As a consequence, a difference of the lattice constants at the boundary/interface can be reduced compared to the direct gallium nitride growth on aluminum nitride.

Figure 3:
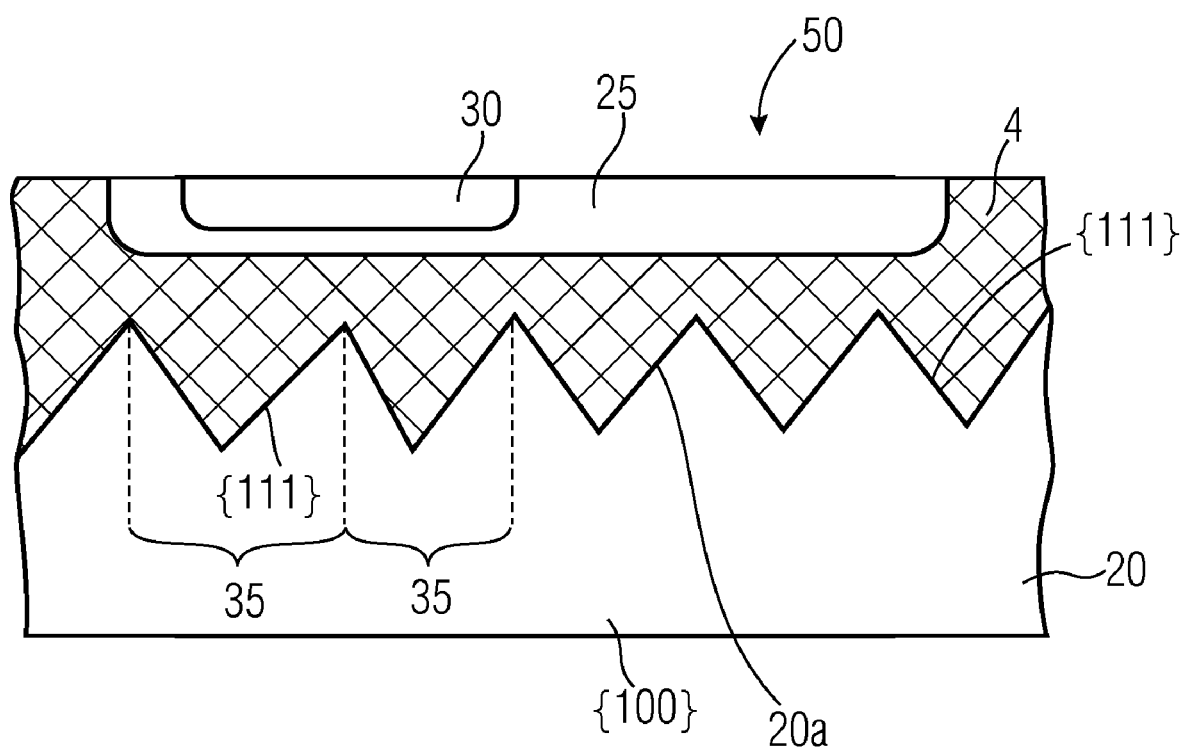
FIG. 3 shows a schematic cross sectional view of a semiconductor structure according to an embodiment of the invention.

In FIG. 3, a semiconductor structure 50 according to an embodiment is shown. The semiconductor structure 50 comprises a substrate 20 with a {100} crystal surface plane, which comprises a plurality of adjacent structured regions 35 at a top side 20a of the substrate 20. The plurality of adjacent structured regions 35 comprise adjacent substrate surfaces with {111} crystal planes. In addition the semiconductor structure 50 comprises a III-V semiconductor material layer 4 above the top side 20a of the substrate 20, with a semiconductor device region 25, which comprises at least one semiconductor device structure 30. The semiconductor device region 25 is at least partly arranged above the plurality of adjacent structured regions 35 at the top side 20a of the substrate 20.

Due to the structured {111} crystal surfaces 35 at the top side 20a of the substrate 20, the number of slip lines or dislocation defects and, hence, the crystal defect density in the III-V semiconductor material layer 4, e.g., gallium nitride layer, above these adjacent structured regions 35 can be reduced compared to III-V semiconductor material layers 4 grown on a flat, unstructured {111} substrate or at least controlled so that the slip lines appear in a higher density at predetermined locations in the semiconductor device region. The quality of the III-V semiconductor material layers 4 grown above the adjacent structured regions 35 may be sufficient to fabricate semiconductor devices with an acceptable or good device performance.

The substrate 20 may, for example, be silicon, but also other substrates comprising another type of semiconductor substrate material can be used. The substrate may be a {100} substrate, for example, a Si(100)-substrate. The notation {100} may include the equivalent planes (100), (010), (001), ($\overline{1}$00), ($\overline{0}$10), and ($\overline{0}$01). The substrate 20 may comprise a plurality of adjacent structured regions 35. These structured regions comprise crystal surface planes with {111} surfaces. In other words, for example, a silicon (100) substrate is structured in such a way that at the top side 20a of the silicon (100) substrate at certain areas, a plurality of adjacent structured regions 35 are formed, wherein these adjacent structured regions comprise exclusively surfaces with {111} crystal orientation. The III-V semiconductor material layer 4 may be arranged above the top side 20a of the substrate. The III-V semiconductor material may, for example, be gallium nitride, which is epitaxial grown on top of the substrate surfaces with {111} crystal planes.

According to another embodiment, the III-V semiconductor material may, for example, be gallium arsenide, indium phosphide or ternary compounds as indium aluminum arsenide. The III-V semiconductor material may, for example, be a III-V nitride material, like indium nitride, aluminum nitride or also ternary nitride compounds like aluminum gallium nitride. This means the III-V semiconductor material layer 4 may comprise ternary compounds as well.

The semiconductor device structure 30 may, for example, be a field-effect transistor (FET) structure or parts of a field-effect transistor, a high electron mobility transistor (HEMT), a diode structure or parts of a diode structure, or other semiconductor device structures or an electric circuit.

According to some embodiments, a part of the semiconductor device region 25 and a part of the semiconductor device structure 30 may be also arranged above regions of the substrate 20, which still comprise partially at the top side 20a of the substrate 20 a {100} crystal surface plane or other crystal surface planes which are different to a {111} crystal surface plane.

According to some embodiments the plurality of adjacent structured regions 35 may exclusively comprise adjacent substrate surfaces with {111} crystal planes. In other words, the {111} crystal planes at the top side 20a of the substrate can be arranged next to each other without comprising any regions with crystal planes different from the {111} crystal planes. In order to achieve a substrate surface with exclusive {111} crystal planes, an etching without masking the substrate surface may be employed. This means that in areas of a substrate which are selected to comprise a {111} crystal surface a masking of the respective areas may not be necessary. An etching of the substrate in an unmasked area may result in a surface which comprises exclusive {111} crystal surface planes. According to some embodiments, the adjacent structured regions 35 may comprise the shape of trenches, pyramidal or inverted pyramidal structures.

Figure 4:
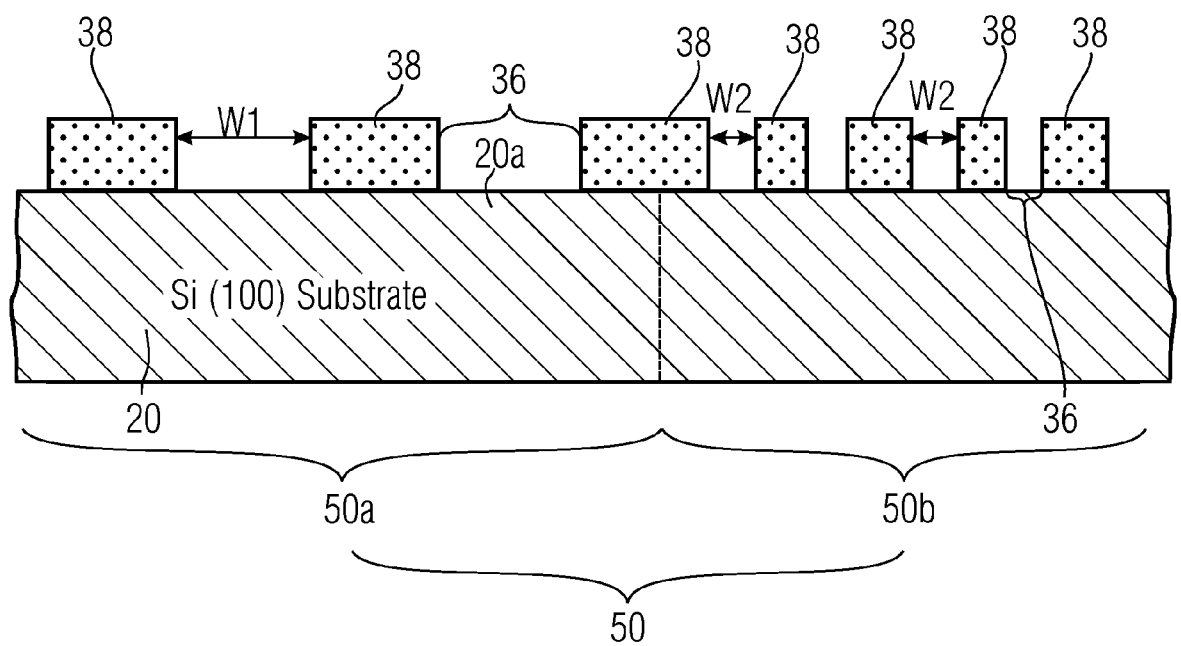
FIG. 4 shows a cross sectional view of a silicon substrate, partially covered with a mask according to an embodiment of the method of forming a semiconductor structure.

In FIG. 4, a Si(100)-substrate 20 with a structured masking layer 38 is shown in a schematic cross sectional view.

According to an embodiment of the method of forming a semiconductor structure, a substrate, e.g., a Si(100)-wafer, may be covered with a mask layer 38. The mask layer 38 may be, for example, an oxide or a nitride layer. This mask layer 38 may be deposited on the top side surface 20a of the silicon substrate 20. According to some embodiments the semiconductor structure 50 may comprise an active device region 50a and a sawing frame region 50b. The masking layer 38 may comprise openings 36. Depending on whether the openings 36 are formed above the active device region 50a or the sawing frame region 50b, the distance between the openings 36 or the shape of the remaining masking layer 38 may be different in the sawing frame region 50b and the active device area 50a. The openings 36 in the masking layer 38 may be formed photolithographically. This means, by means of photolithographic techniques openings or holes and, for example, also holes or openings for a subsequent substrate etching for alignment marks, may be etched in the masking layer 38. The width W1 of the openings 36 in the active semiconductor device area 50a may be different to the width W2 of the openings in the sawing frame region 50b. The same may be true for the distance of the holes or, in general, openings. The distance of the openings 36, e.g., holes, and the exact shape or size of the openings in the sawing frame may be chosen on purpose so that a subsequent etching of the silicon substrate also results to substrate surfaces different to {111} crystal planes. In other words, the shape, the width or the distance of the openings or holes 36 of the masking layer 38 above the sawing frame region 50b may be chosen on purpose so that in a subsequent gallium nitride deposition a high number of slip lines develop in the sawing frame. As a consequence a high slip line density may exist in the sawing frame region 50b and, hence a mechanical stress or lattice stress in the III-V material layer 4, e.g. the gallium nitride layer, is systematically diminished. As a consequence cracks in the III-V semiconductor material layer 4 and in the wafer bow can be prevented. Therefore the sawing frame region 50b may be also named lattice stress compensation region 50b. The lattice stress compensation region 50b can be included in a semiconductor structure 50 in order to reduce the mechanical stress, i.e., the compressive stress and/or the tension strength due to a lattice mismatch between the substrate 20 and the III-V semiconductor material layer 4.

This means, according to some embodiments of the method of forming a semiconductor structure 50, forming of an active device region 50a and/or a sawing frame region 50b can be performed by means of a mask layer 38 or it can also be performed without the usage of such a mask layer 38.

According to some embodiments the mask layer 38 above the active device region 50a and/or the sawing frame region 50b may comprise openings 36. The openings in the sawing frame region 50b and/or the active device region 50a may comprise the same or a different shape and size. The openings 36 in the mask layer 38 above the active semiconductor and/or sawing frame region may comprise any geometrical shape and/or size which is suitable or useful to create a desired semiconductor structure. It should be noted that in other embodiments the mask layer 38 above the active device region 50a and/or the sawing frame region 50b does not comprise any openings 36.

Figure 5:
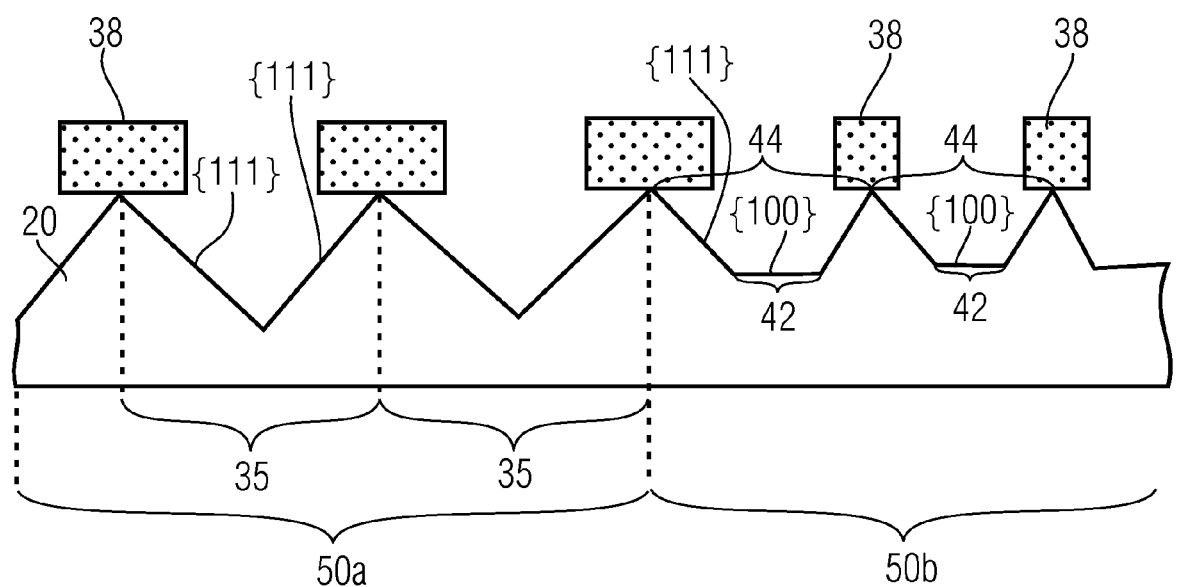
FIG. 5 shows a schematic cross sectional view of a silicon substrate after etching the substrate according to an embodiment of the method for forming a semiconductor structure.

According to embodiments, forming a plurality of adjacent structured regions 35 with adjacent substrate surfaces with {111} crystal planes may comprise depositing a masking layer 38 at the top side 20a of the {100} substrate 20. It may furthermore comprise locally removing the masking layer 38 from the top side 20a of the substrate 20. This means openings are formed in the masking layer 38. As a consequence, the top side 20a of the substrate 20 with the {100} crystal surface plane is locally exposed. By etching the locally exposed top side of the substrate 20, the plurality of adjacent structured regions 35 with the adjacent substrate surfaces with {111} crystal planes can be formed. The locally exposed areas 36 of the silicon substrate 20 may be etched, for example, with KOH, so that the substrate 20 comprises exclusively Si (111) crystal planes. These {111} crystal substrate surface planes may comprise an angle of 35°+/−5° to the original {100} substrate surface. As a consequence, depending on the exact shape of the openings and the structure of the masking layer (hard mask) 38, the surface at the top side of the substrate 20 may comprise, for example, pyramids or pyramidal structures as it is schematically shown in FIG. 5.

The semiconductor structure 50 comprises a substrate 20 with a plurality of adjacent structured regions 35 in an active semiconductor area 50a of the substrate. This means that in this region 50a, the {100} substrate surface exclusively comprises adjacent substrate surfaces with {111} crystal planes. In some embodiments the substrate 20 in the sawing frame region 50b may still comprise {100} crystal surface planes 42 or, in general, crystal planes different from {111} crystal planes. In general, the shape of the openings 36 (FIG. 4) in the sawing frame region 50b may be different to the shape of the openings 36 in the active semiconductor area 50a. Due to the difference in the shape of the openings, a subsequent etching may result in the adjacent structured regions 35 with {111} crystal substrate planes in the active semiconductor area 50a and in structured regions 44 in the sawing frame region 50b. The structured regions 44 may comprise a different shape compared to the adjacent structured regions 35 in the active semiconductor area 50a of the semiconductor structure 50. The shape and/or the size of the openings 36 in the hard mask can be adapted so that after the subsequent etching the remaining parts of the hard mask 38 are still self-supporting.

As a consequence of the differently shaped structured regions 35 and 44, in a subsequent epitaxial growth of a III-V semiconductor material layer 4, a dislocation defect density in the III-V material layer 4 above the sawing frame region 50b may be higher than in the active semiconductor region 50a. In other words, the shape of the structured regions 44 in the sawing frame region 50b can be chosen on purpose, so that in this region in a subsequent growing process the number of dislocations or slip lines is higher than in a III-V semiconductor material grown above the active semiconductor region 50a. Therefore a mechanical or lattice stress, a strain, a tension, a tensile strength or a crystal lattice compression strength, which develops during the growth of the crystalline material on top of the substrate 20, wherein the crystalline materials comprise a different crystalline lattice size, can be reduced in the sawing frame region 50b. This can be achieved by choosing the structured region 44 in the sawing frame region 50b so that lattice defects are provoked in a subsequent III-V semiconductor material layer 4 deposition.

Figure 6A:
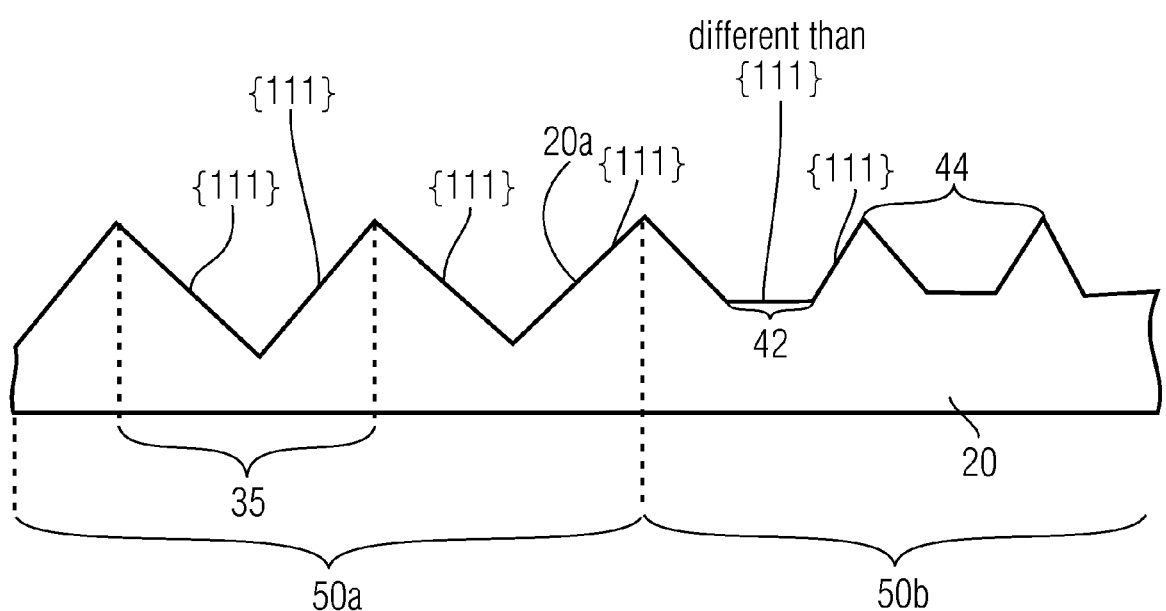
FIG. 6a shows a schematic cross sectional view of the substrate after the removal of remaining masks portions according to an embodiment.

In FIG. 6a, the substrate 20 is shown after the removal of the masking layer 38 from the surface of the substrate according to some embodiments of the method of forming a semiconductor structure. Depending on the exact shape of the openings 36 and the masking layer 38, the substrate surface may comprise a different shape after etching.

Figure 6B:
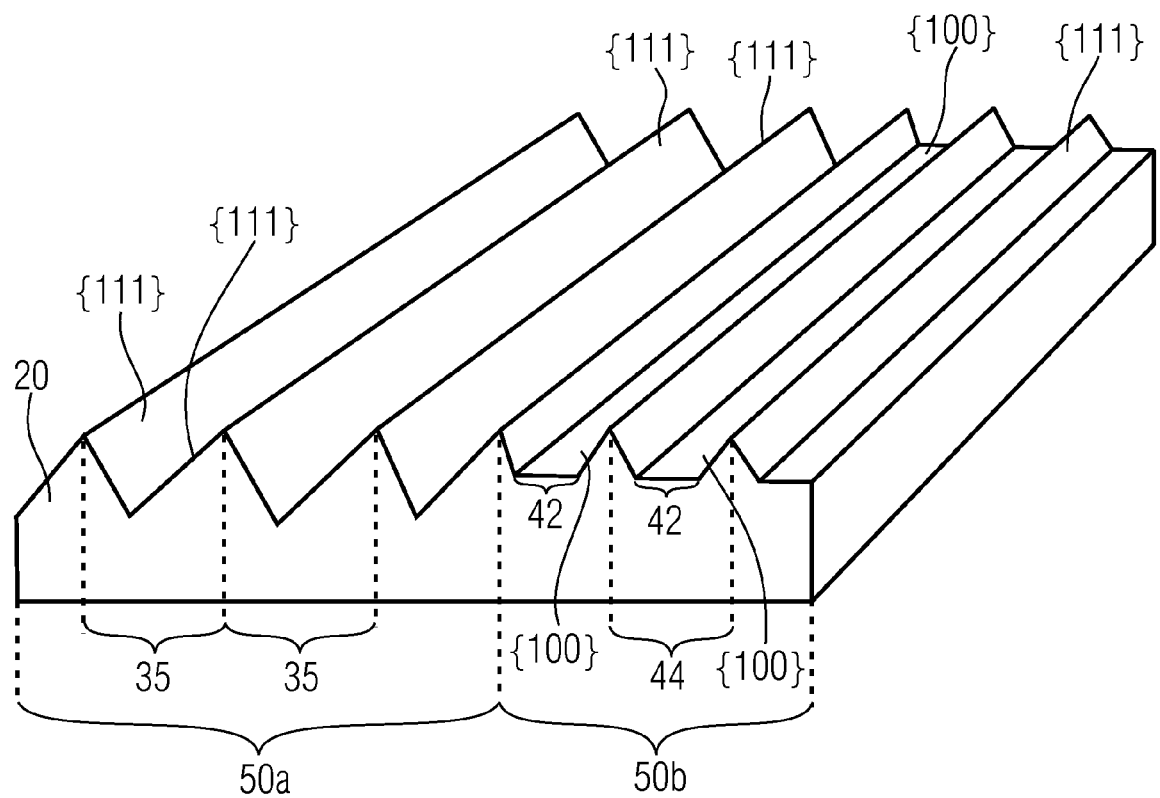
FIG. 6b shows a perspective view of the substrate, wherein the substrate comprises trenches according to an embodiment.
Figure 6C:
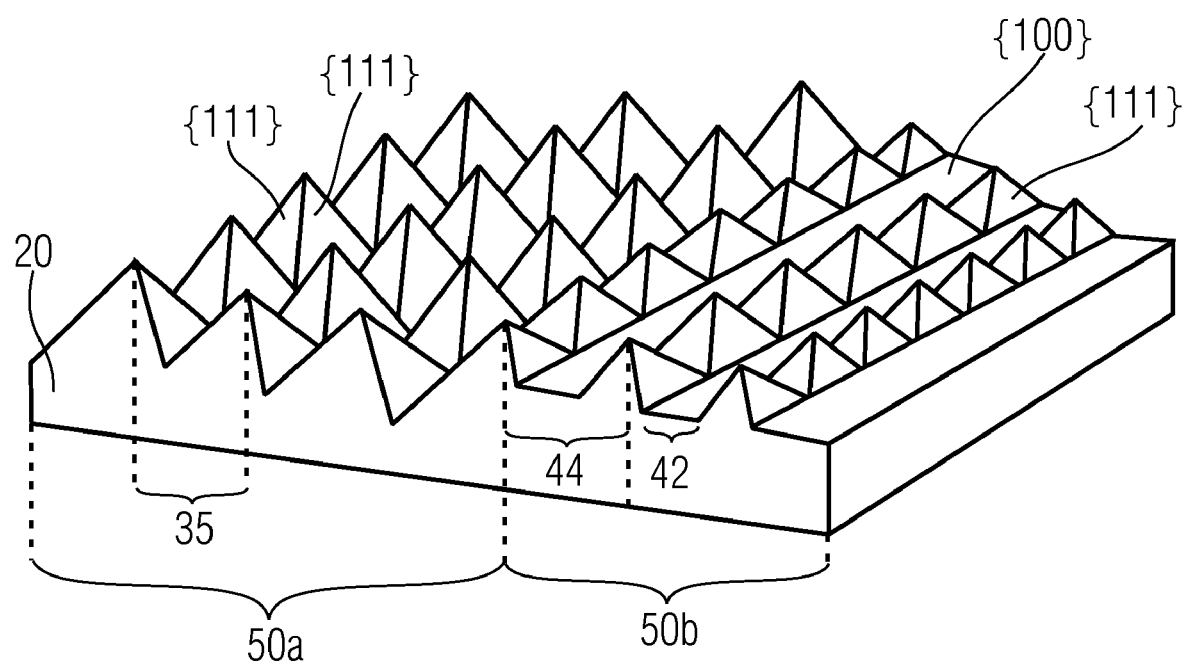
FIG. 6c shows another perspective view of a substrate, wherein the surface comprises pyramidal structures according to another embodiment.

According to some embodiments, the top side of the substrate may comprise trench structures (FIG. 6b), wherein the surfaces of the trenches comprise {111} crystal planes. If the semiconductor structure 50 comprises a sawing frame region 50b, this region can also comprise substrate surfaces 42 with crystal planes different from {111} crystal planes, for example, with {100} crystal planes According to another embodiment, the openings 36 in a masking layer 38 can be chosen so that in a subsequent etching process pyramidal structures or pyramids are formed at the top side 20a of the silicon substrate 20 (FIG. 6c). Each wall or flank of a pyramid may comprise a substrate surface with a {111} crystal plane. If a semiconductor structure 50 comprises, for example, a sawing frame region 50b or other regions which are not part of the active semiconductor region 50a, then the top side 20a of the substrate 20 may also comprise areas 42 with crystal planes different from {111} crystal planes, for example, {100} crystal planes. After removal of the remaining hard mask 38 from the top of the substrate 20, a buffer layer 8 may be deposited on the top side 20a of the substrate 20, according to some embodiments. The buffer layer 8 may comprise aluminum nitride (AlN). The buffer layer 8 may, for example, be formed by means of metal organic chemical vapor deposition (MOCVD). The buffer layer 8 can, for example, be formed by a high temperature aluminum nitride deposition in a metal organic chemical vapor deposition process.

Figure 6D:
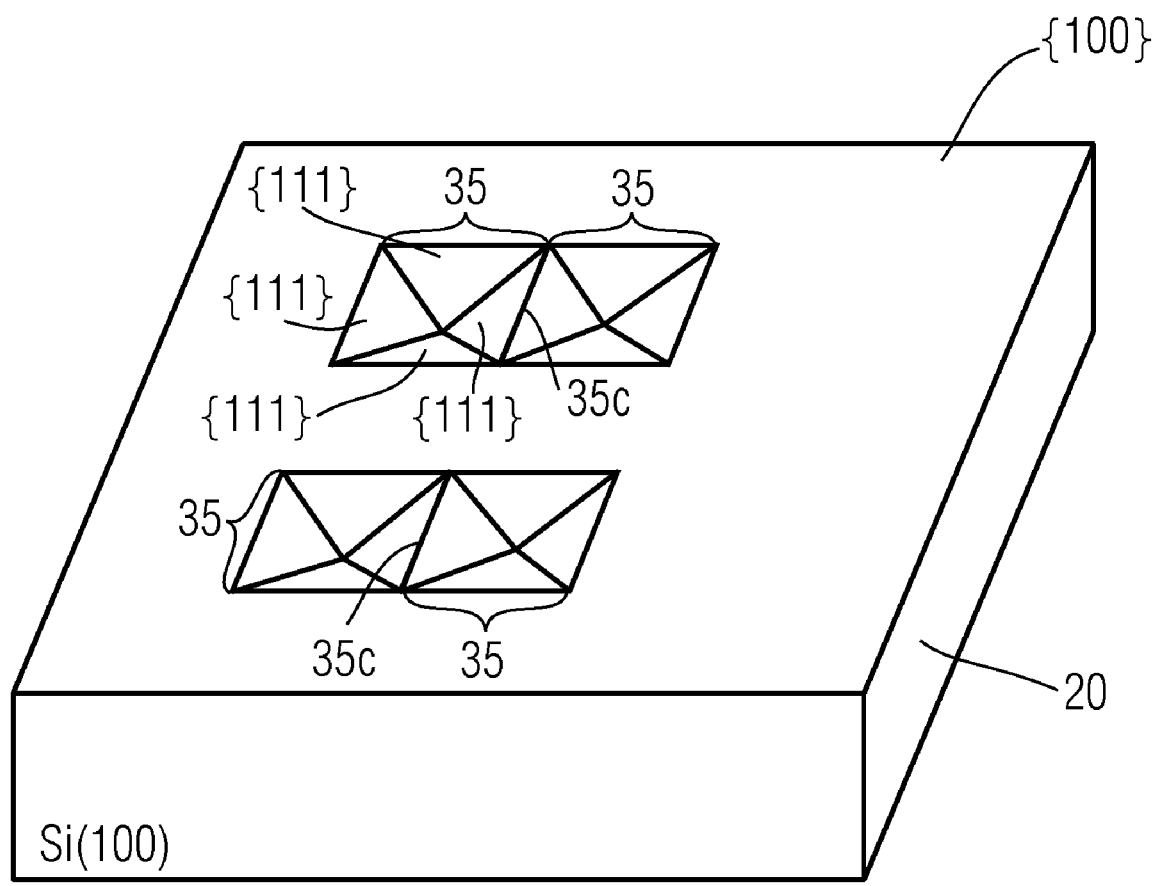
FIG. 6d shows another perspective view of a substrate, wherein the surface comprises a plurality of each two inverted pyramidal structures according to another embodiment.
Figure 6E:
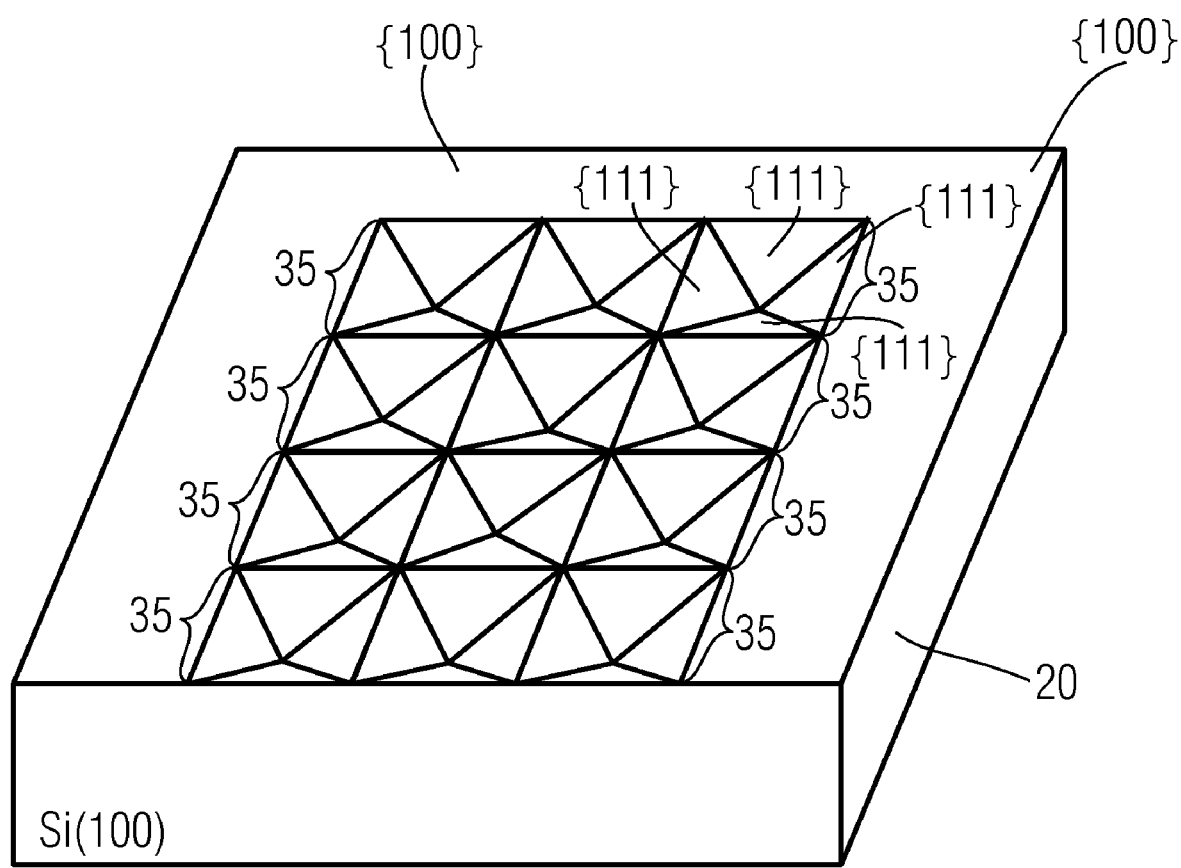
FIG. 6e shows another perspective view of a substrate, wherein the surface comprises inverted pyramidal structures according to another embodiment.

FIGS. 6d and 6e, show further embodiments of a substrate with structured regions 35 having {111}-crystal surface planes in a {100} substrate. In FIG. 6d each two structured regions are arranged adjacent to each other, so that the structured regions comprise a common adjacent edge 35c. The structured regions 35 comprise an inverted pyramidal structure. In FIG. 6e a plurality of such structured regions 35 which are formed as inverted pyramids are shown. An active semiconductor region 50a may be formed at least partly above the structured regions 35. It should be noted that there exist a number of further embodiments with different arranged structured regions 35 in the substrate. All these embodiments are included therein. A plurality of structured regions 35 may include 2, 3 or more structured regions 35, wherein each two structured regions comprise at least one common adjacent edge 35c.

Figure 7A:
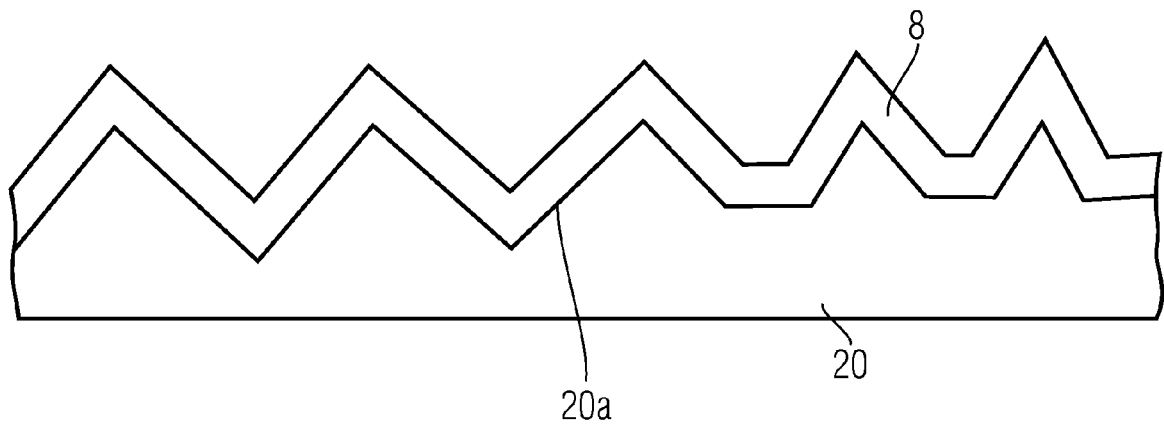
FIG. 7a shows a schematic cross sectional view of a substrate, wherein the substrate is covered with a buffer layer according to an embodiment.

According to different embodiments, there may be one (see FIG. 7a) or a plurality of buffer layers 8 on top of the substrate 20. The buffer layer 8 or the plurality of buffer layers can be insulating layers according to some embodiments. The buffer layer 8 may comprise different Al(x)Ga(1−x)N layers with a decreasing share of aluminum. As a consequence, a difference of the lattice constants at the boundary/interface can be reduced compared to the direct gallium nitride growth on aluminum nitride. The buffer layer 8 can comprise one or more layers, which may comprise a gradual share of aluminum, so that a gradual adaptation of the lattice constant of the substrate and the III-V semiconductor material can be achieved. In other embodiments, at least one buffer layer 8 may comprise, for example, amorphous silicon-nitride, aluminum nitride, aluminum gallium nitride, a silicon delta doping ($\delta$Si), etc.

Figure 7B:
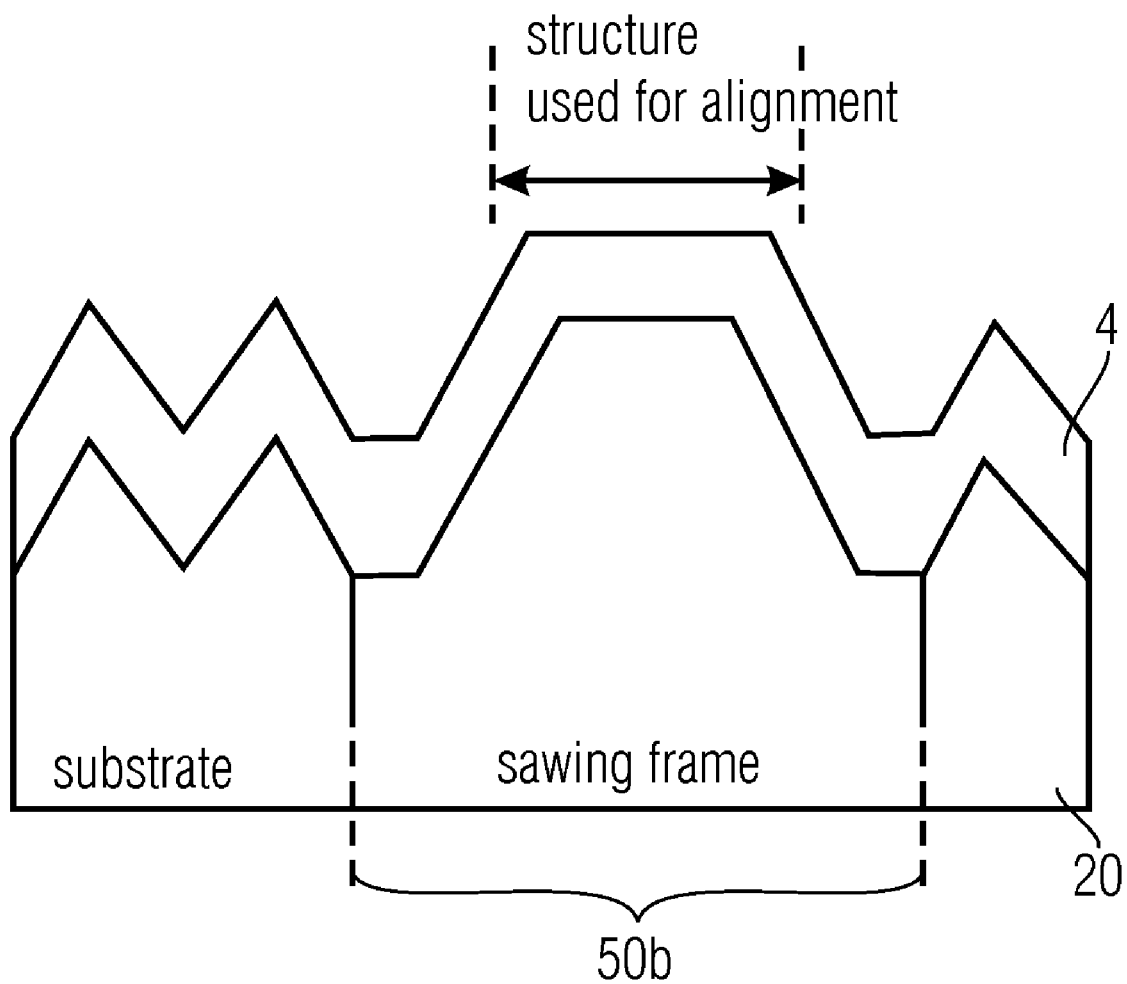
FIG. 7b shows a schematic cross sectional view of a substrate, wherein the substrate comprises a sawing frame or lattice stress compensation region which is covered with a III-V semiconductor material layer.

In FIG. 7b a substrate 20 is shown, wherein the substrate 20 comprises a sawing frame region 50b or a lattice stress compensation region 50b. On top of the substrate 20 a III-V semiconductor material layer 4 is be grown. The sawing frame region 50b with the deposited III-V semiconductor material can be used as an alignment mark, since it may comprise, for example, a structure, a height or a defect density which is different to the surrounding areas.

According to another embodiment the substrate may comprise a buffer layer and on top of the buffer layer 8 a III-V semiconductor material layer 4 is grown. The III-V semiconductor material layer 4 can, for example, be a AlGaN or a GaN-layer. According to some embodiments, the top side 20a of the substrate may be structured at certain areas 50b so that the epitaxial growth of a III-V semiconductor material layer 4 is hindered or accelerated. At the certain areas, e.g., the sawing frame regions 50b or lattice stress compensation regions 50b, the substrate 20 may be etched deeper or less deep compared to the adjacent substrate regions, so that the certain areas comprise a different height compared to the adjacent areas, and hence, can be used as alignment marks. In FIG. 7b such an example is schematically depicted. According to this embodiment, for example, the substrate 20 in a sawing frame region 50b is not etched at all and can therefore be used as alignment mark after a subsequent GaN deposition, since the height of the GaN layer above the sawing frame region 50b and the surface is different to the adjacent region. Not etching a certain area of a substrate is, for example, a simple way to realize an alignment mark. If in a subsequent deposition process the III-V material is carefully grown, the areas which have not been etched are visible and can be used as alignment marks. The term carefully grown can here mean to deposit a III-V material layer so that a contrast of the alignment mark to the adjacent semiconductor regions at the surface can be achieved. This may be achieved, for example, by depositing a III-V material layer with a proper thickness. Furthermore it is possible that based on a different growth rate and/or a different growth direction the III-V material on top of the alignment mark is growing faster than in the surrounding areas, and hence a contrast can be achieved.

An alignment mark may be manufactured by etching the substrate 20 so that in a subsequent III-V material growth process the alignment mark comprises an attribute, e.g., the height, the structure or also the defect density which is different to the adjacent substrate. This means the alignment mark may comprise, for example, a different height, a different structure or a different defect density.

Figure 7C:
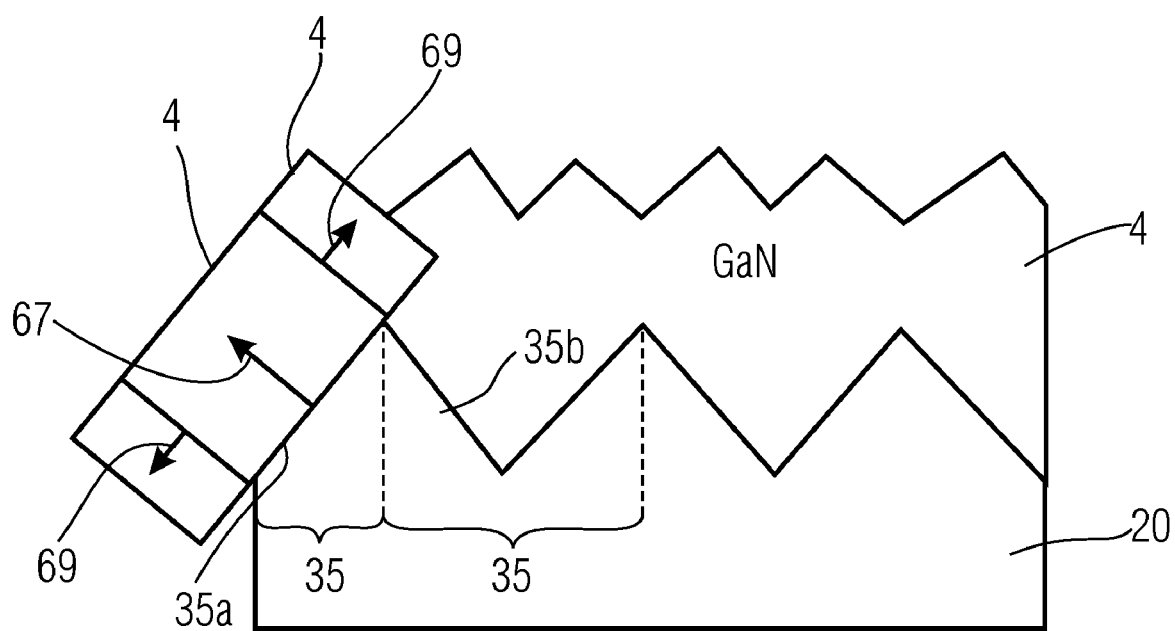
FIG. 7c shows a schematic view of the GaN-growth on a substrate.

In the following FIGS. 7c-e examples for different GaN-growth mechanism are schematically depicted.

The different possible mechanisms for the growth of the III-V semiconductor material layer 4 above the plurality of adjacent structured regions 35 on the top side 20a of the substrate comprising {111} crystal planes may result in a reduced dislocation defect density or slip line density in the III-V semiconductor material layer 4 compared to a growth on a {111} substrate, comprising at the top side a plane, unstructured {111} crystal surface. The III-V semiconductor material layer, e.g., GaN, may be grown using standard growth parameter or optimized growth parameter.

Gallium nitride may grow in different directions of its unit cell with a different growth rate. For example, during molecular beam epitaxy (MBE) deposition of the GaN-epitaxial growth in the direction of the c-axis of the unit cell may be faster than in direction of the a-axis, perpendicular to the c-axis. GaN grows mostly not only in one crystallographic direction, but it grows with a different growth rate in different crystallographic directions. Gallium nitride may, for example, grow perpendicular or slightly tilted, for example, at an angle of +/−5° on a Si(111)-substrate or in general on {111} substrate surfaces of a silicon or sapphire substrate. After the growth of the gallium nitride on top of the buffer layer, the layer may comprise again a certain morphology. As schematically depicted in FIG. 7c the GaN 4 may start to grow at the flanks 35a, 35b in the structured region 35 in the form of pillars 67, wherein the pillars also grow with a reduced growth rate in lateral direction 69. The resulting GaN-layer may comprise a surface with valleys and tips.

Figure 7D:
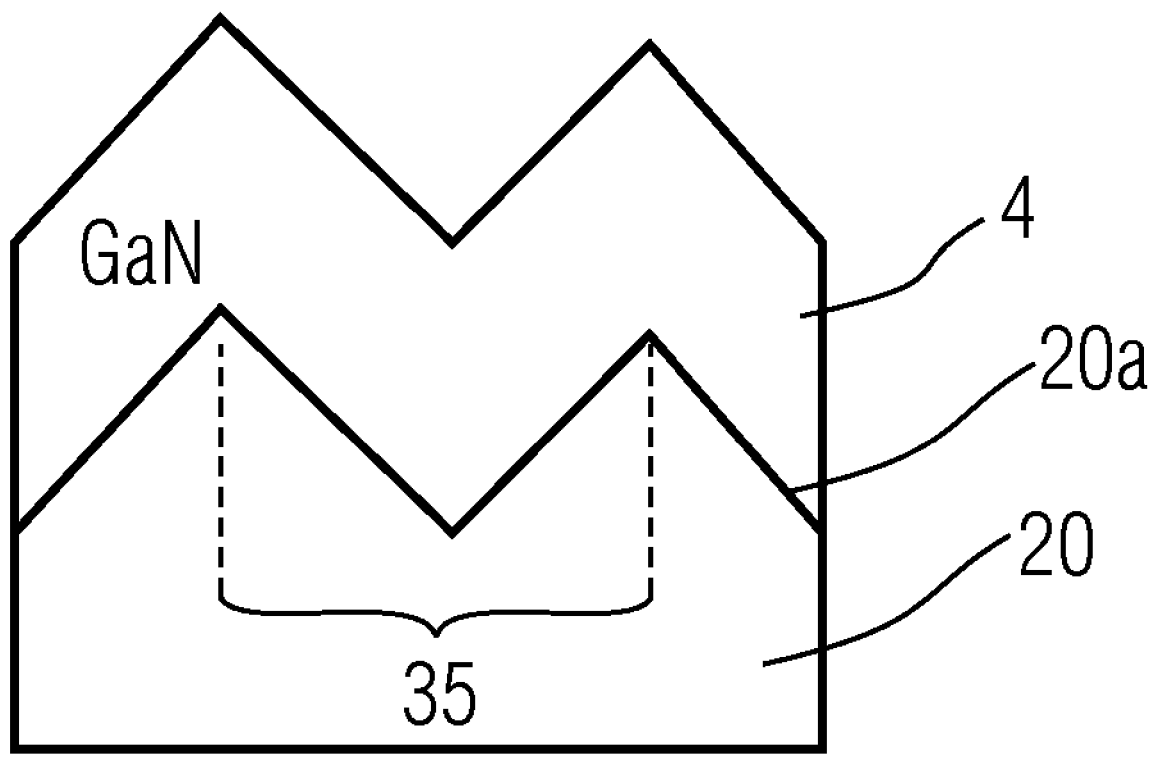
FIG. 7d shows a schematic cross sectional view of a GaN-growth on a substrate.
Figure 7E:
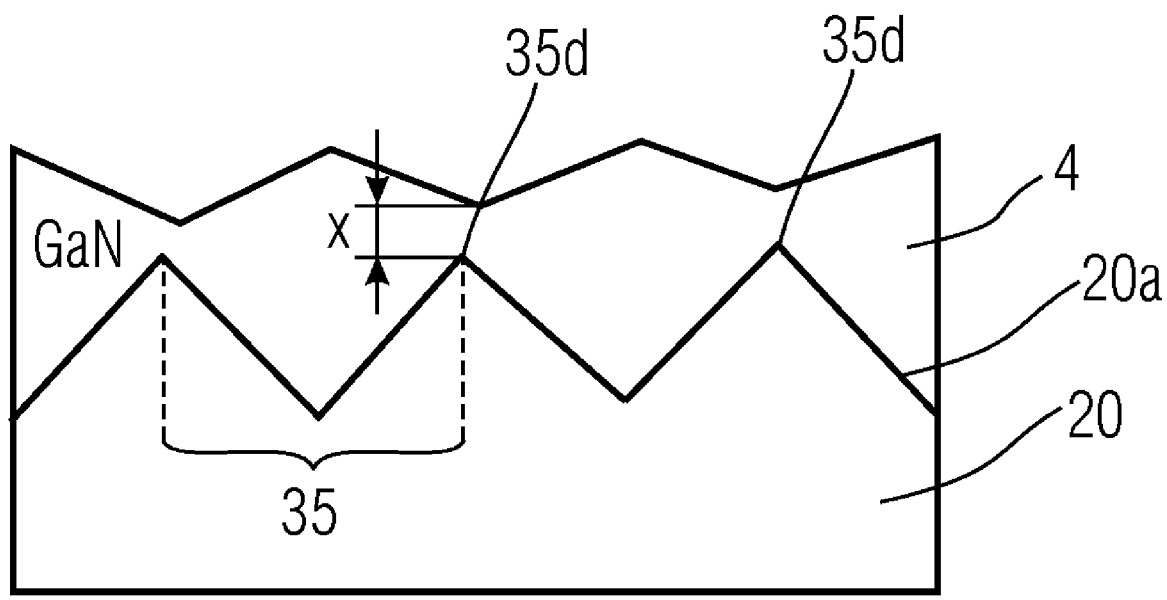
FIG. 7e shows another schematic cross sectional view of a GaN-growth on a substrate.

It is also possible that the grown GaN layer 4 comprises a more flat surface, or as it is shown in FIGS. 7d and 7e that the thickness of the grown GaN-layer 4 may comprise a different thickness x with respect to the surface of the substrate 20. In some embodiments the GaN, material layer 4 may only be grown in the valleys or in the structured regions 35 of the substrate and the thickness x of the GaN-layer at the tips 35d of the substrate may be, e.g., between 0 nm and 50 μm, between 0 nm and to 10 μm or between 0 nm and 5 μm.

Figure 8:
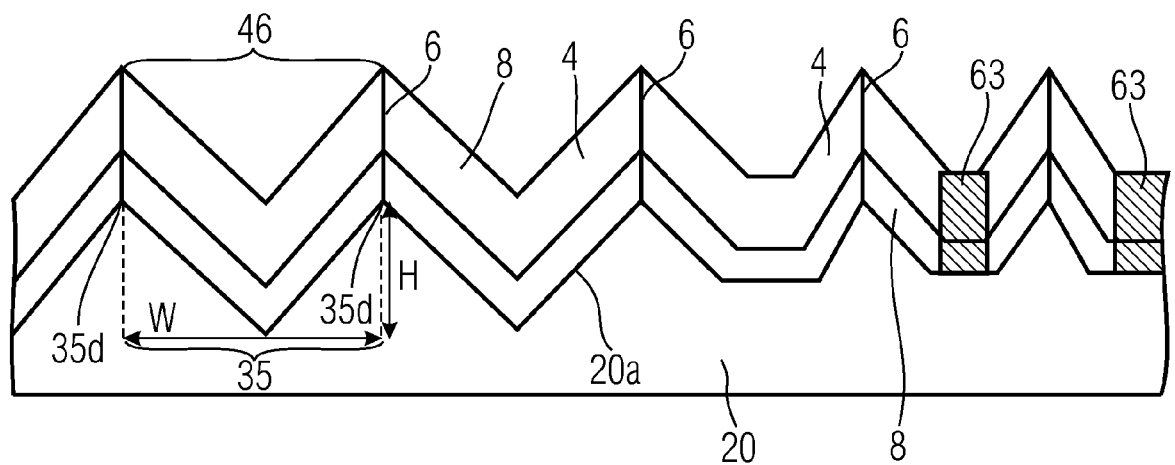
FIG. 8 shows a schematic cross sectional view of a semiconductor structure comprising a gallium nitride layer on top of a buffer layer on a substrate according to an embodiment.

In FIG. 8, a substrate 20 is shown with adjacent structured regions 35, wherein the structured regions comprise a certain dimension defined by the width W, the height H and (not shown in FIG. 8) the length L. On top of the substrate 20, a buffer layer 8 may be arranged and on top of the buffer layer 8, above the adjacent structured regions 35, a gallium nitride layer 4 may be epitaxially grown. According to this embodiment, the dimensions of the structured regions 35 may be chosen so that the epitaxial growth can be performed so that a gallium nitride layer 4 with a high quality can be achieved. This means that the gallium nitride layer 4 may comprises a lower dislocation defect density or slip line density, for example, in an active semiconductor area 50a, than a gallium nitride layer 4 formed on a unstructured silicon substrate with {111} crystal surface plane. Dislocation defects or slip lines 6 may develop if the gallium nitride layers 4 of the different structured regions 35 grow together and may be accumulated above the tip 35d and/or valleys (shown in FIG. 10) of the structured regions 35. As a consequence the gallium nitride layer 4 may comprise areas 46 between the tips 35d with a low crystal lattice defect density or slip line density. These regions 46 can be used as active semiconductor regions 50a or semiconductor device regions 25 for forming semiconductor device structures in the semiconductor structure 50.

According to some embodiments, a high reduction of crystal lattice defects, e.g., slip lines in the III-V semiconductor material layer 4 can be achieved by forming structured regions on the top side 20a of the substrate 20 and by growing above those structured regions a gallium nitride layer 4. The structured regions comprise an optimized dimension so that the grown gallium nitride layer 4 comprises almost no slip lines 6.

Figure 9:
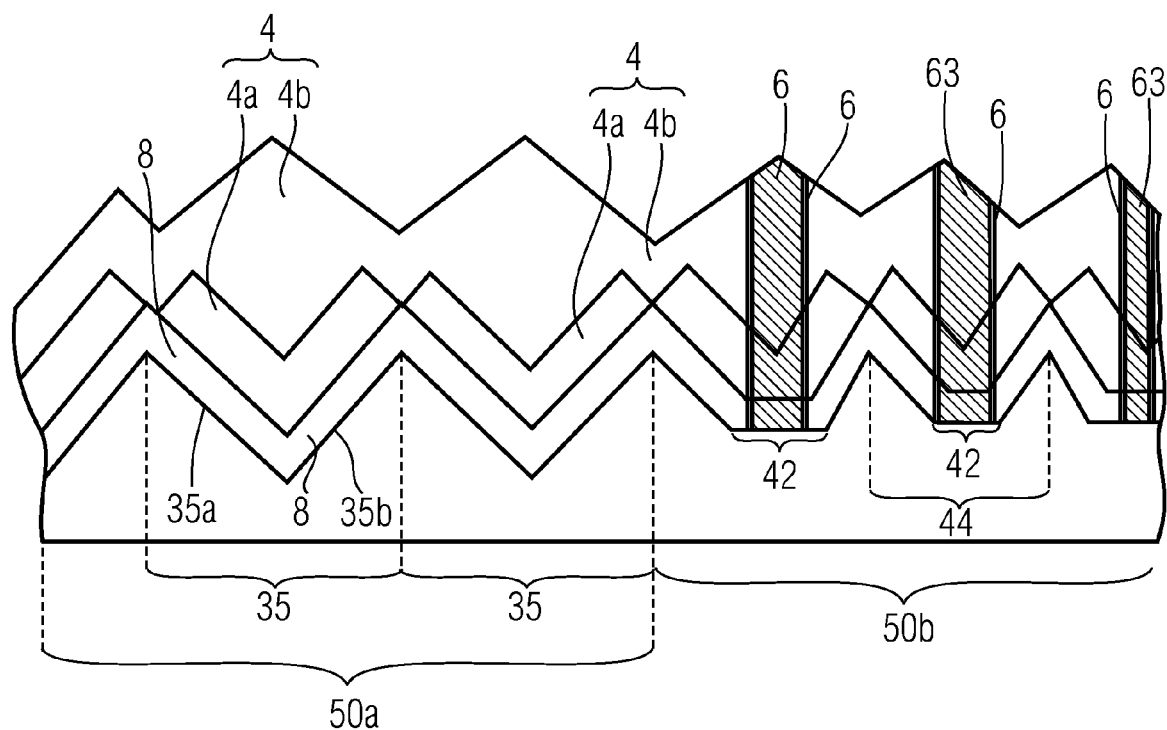
FIG. 9 shows a cross sectional view of a semiconductor structure with a high number of dislocation defects at a sawing frame region of the semiconductor structure according to an embodiment.

In a further embodiment the crystal growth, for example, by means of MOCVD, may comprise a low selectivity with respect to the orientation of the substrate. In this case, the adjacent structured regions 35 may be overgrown similar to the method of ELOG (see FIG. 2). As a consequence, in an optimized crystal growth process it may be possible to deposit a III-V semiconductor material layer 4 with little crystal defects or slip lines 6. The slip line density in such regions with little crystal defects may be, for example, between $10^7$-$10^{13}$ cm$^{-2}$, between $10^9$-$10^{11}$ cm$^{-2}$, i.e., for example, $10^{10}$ cm$^{-2}$. If the quality of the deposition is not good enough, the slip lines 6 may mainly appear in predetermined regions 42 of the gallium nitride layer 4, for example, in the sawing frame region 50b. Therefore the certain regions or sawing frame regions 50b may not be used as an active semiconductor region 50a. As it is schematically depicted in FIG. 9, the sawing frame region 50b may comprise a high number of slip lines 6. The GaN material in the sawing frame region 50b may comprise a low quality with a high number of crystal defects 6. The quality of this GaN material may not be sufficient to form there an active semiconductor device structure with a good performance. The high number of slip lines or crystal defects 6 may be caused by the growth of the gallium nitride layer 4 on non-optimized structured regions 44 or by the growth on regions 42 with a different surface plane, like Si {100} surface planes, with respect to a more defect-free gallium nitride growth in the structured regions 35. The non-optimized structured regions 44 in the sawing frame region 50b may, for example, still comprise {100} silicon substrate surfaces 42. Therefore the high lattice mismatch between the {100} silicon substrate and the gallium nitride layer in the sawing frame 50b, a high number of slip lines 6 may develop in the sawing frame region 50b.

According to the embodiment shown in FIG. 9 the structured regions 44 may comprise regions 63 with an increased defect density, e.g., with slip lines, compared to the rest of the structured region 44. For that, crystal planes which are different to a {111} crystal plane can be formed at the substrate regions 42, as described in some embodiments herein. The growth of the III-V semiconductor material layer 4 may be performed so that an ELOG-like overgrowth of the adjacent structured region is performed. Thus, a III-V semiconductor material layer, e.g., a gallium nitride layer 4 can be formed with a high quality comprising a reduced number of slip lines or crystal defects 6 at least in an area 50a which is used for forming a semiconductor device compared to layers, which are formed on a substrate surface, which do not comprise the above-mentioned adjacent structured regions 35.

In some embodiments the semiconductor structure 50 may comprise a first region, e.g., the semiconductor device region 25 or the active semiconductor region 50a, of the III-V semiconductor material layer 4 which overlaps the plurality of adjacent structured regions 35, and which comprises a lower crystal defect density than a second region 63 of the III-V semiconductor material layer 4 which overlaps the sawing frame region 50b.

According to another embodiment the semiconductor structure 50 may comprise a first region, e.g., the semiconductor device region 25 or the active semiconductor region 50a of the III-V semiconductor material layer, which overlaps the plurality of adjacent structured regions 35, and which comprises a higher crystal lattice tension or crystal lattice compression strength than a second region 63 of the III-V semiconductor material layer, which overlaps the sawing frame region.

According to another embodiment, the epitaxial growth of the III-V semiconductor material layer can be performed almost defect-free, if the adjacent structured regions 35 comprise {111} crystal surface planes, which comprise dimensions as described above. According to other embodiments, the III-V semiconductor material layer 4 can be grown so that the slip lines 6 are merged at least partially when, for example, gallium nitride from different surface planes 35a, 35b of the adjacent structured regions 35 grows together.

Figure 10:
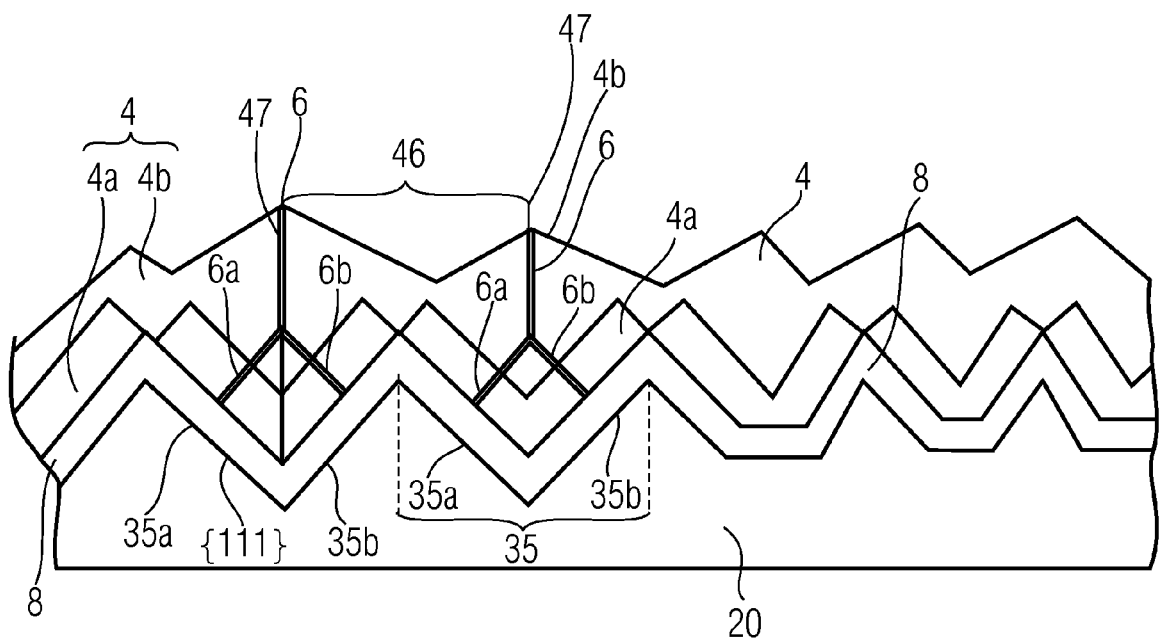
FIG. 10 shows another cross sectional view of a semiconductor structure according to an embodiment.

In FIG. 10, this situation is schematically shown. A substrate 20 may comprise adjacent structured regions 35 with adjacent substrate surfaces 35a, 35b with {111} crystal planes. On top of the substrate 20, a buffer layer 8 can be arranged. If at the top of the buffer layer 8 the III-V semiconductor material layer 4 is grown, the growth may start at the flanks 35a and 35b of the respective structured region 35. This chronicle sequence is indicated in FIG. 10 by the gallium nitride layers 4a. This means at the beginning, a gallium nitride layer 4a starts to grow on the flanks of the structured regions 35 forming the gallium nitride layer 4a. Each of these growing layers 4a form two flanks 35a and 35b which can comprise defects, e.g., slip lines 6a, 6b. In case the structured regions 35 comprise small dimensions, for example, a depth between 0.5 nm and 100 nm or between 1 nm and 1 μm the gallium nitride layer 4a may grow without or only with a less number of defects, but may still comprise a tension. According to some embodiments the slip lines 6a, 6b may grow perpendicular, i.e., with 90°±5° to the {111} substrate surfaces 35a, 35b.

But if the gallium nitride is grown in a direction different to the c-axis the slip lines 6a, 6b may comprise a different angle with respect to the {111} substrate surfaces 35a, 35b. The same may be true if the III-V material layer 4 grows not flat, but tilted on the {111} substrate surfaces. According to the exact conditions of the substrate surface and the III-V material growth, the defects, e.g., the slip lines 6a, 6b may comprise different angles with respect to the {111} substrate surfaces.

As described above, if the two gallium nitride layers 4a in the structured regions 35 grow together, the slip lines 6a and 6b may be hindered to grow further. Instead, because of the different lattice position of the two gallium nitride layers 4a, which grow together in the structured region 35, new slip lines 6 may be formed. These slip lines 6 may grow vertically upwards in the further grown gallium nitride layer 4b, but the overall number of dislocation defects or slip lines may be reduced in the active device region 50a (see FIG. 6a) and there the grown III-V semiconductor material may comprise a higher quality than an III-V semiconductor material layer grown on a plane, unstructured {111} substrate. The quality may be sufficient to form in a III-V semiconductor material layer 4 semiconductor devices with a high device performance. In addition, as it is schematically shown in FIG. 10, the crystal lattice defects, e.g., slip lines, are accumulated at certain areas 47 of the wafer or semiconductor structure 50. This can be used to form in a subsequent process semiconductor structures in the defect free areas 46 or in the areas with a low defect density 46 compared to the areas 47 with the accumulated crystal defects 6. In other words, the semiconductor structures can be manufactured in areas 46 of the III-V material layer which comprise a lower defect density than certain areas 47 which comprise the accumulated crystal lattice defects, e.g., the slip lines 6.

In the embodiment described above, the slip lines 6 may be accumulated in the deepenings or valleys of the structured regions 35. This means the area 46 of the gallium nitride layer 4a between adjacent structured regions 35 may comprise a lower crystal lattice defect or slip line density than the areas 47 above the deepenings or valleys. Such areas 46 with a low defect density may be used for forming semiconductor device structures in the GaN-nitride layer 4a.

According to another embodiment, the adjacent structured regions 35 may comprise a width W, a height H and in a third dimension, a length L. If the dimensions of the adjacent structured regions 35 comprise a proper size a deposition of GaN on a Si {111}-substrate can be performed so that the GaN layer grows after the deposition of some nanometers either having almost no lattice stress but crystal defects or having more lattice stress and less crystal defects. A proper size for at least one of the dimensions, the width W, the height H or the length L of the structured regions 35 may be between 0.5 nm and 2 μm, 1 nm and 500 nm or between 100 nm and 1 μm. The epitaxial growth of the gallium nitride layer can be, for example, performed by means of molecular beam epitaxy (MBE), so that the gallium nitride layer grows on a Si {111}-structure with low lattice stress or low crystal defects if the respective structures are small enough.

Dislocation defects or slip lines 6 may also grow in the direction of the c-axis of the unit cell in the gallium nitride. If the gallium nitride grows together from the two sides or flanks 35a, 35b of the {111} crystal plane in an adjacent structured region 35, the slip lines 6a, 6b may be hindered to continue to grow (see FIG. 11a). The slip lines may accidently merge and thus their number may be reduced. This means that the dislocation defects or slip lines may be disabled from growing further if the two gallium nitride layers grow together. But due to the different lattice position of the gallium nitride layers growing from the different flanks 35a, 35b of the adjacent structured regions 35, dislocation defects or slip lines 6 may be formed, which grow vertically upwards. One of the lattice orientation may be dominating. This may result in an overgrowth of the slip line and the differently orientated lattice. There may be only one orientation of the semiconductor layer present at the surface of it.

Figure 11A:
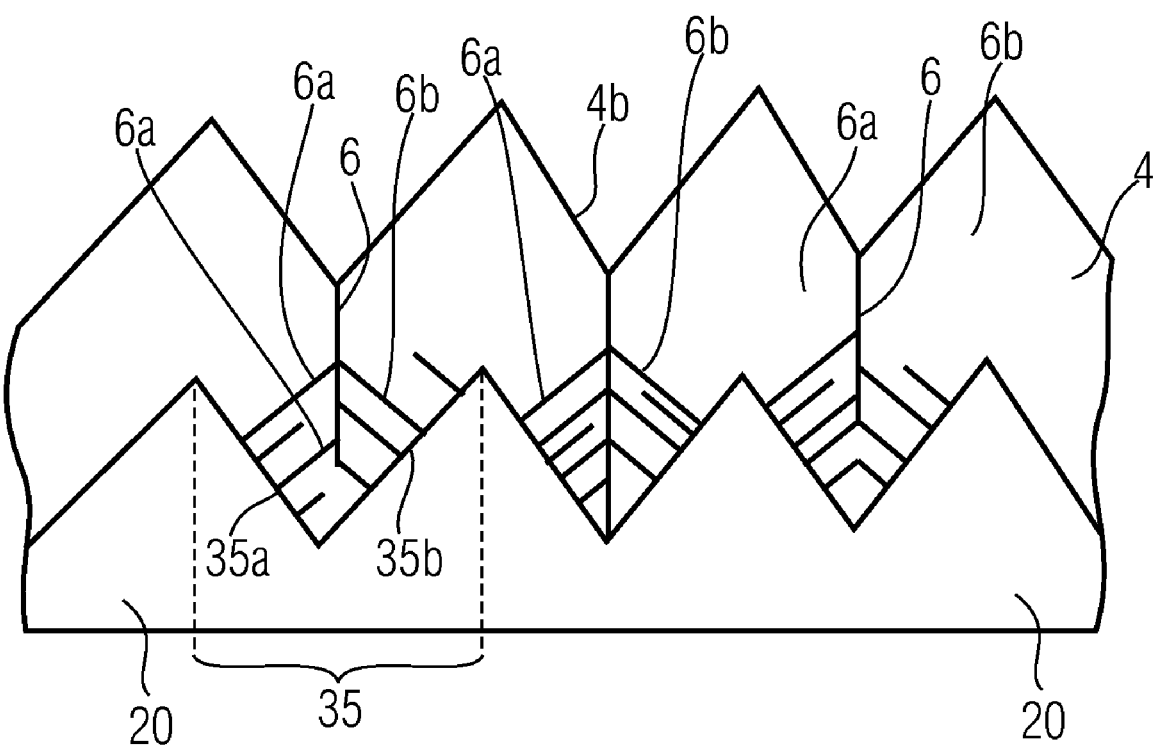
FIG. 11a shows another cross sectional view of a semiconductor structure comprising a gallium nitride layer arranged on top of a silicon substrate according to another embodiment.
Figure 11B:
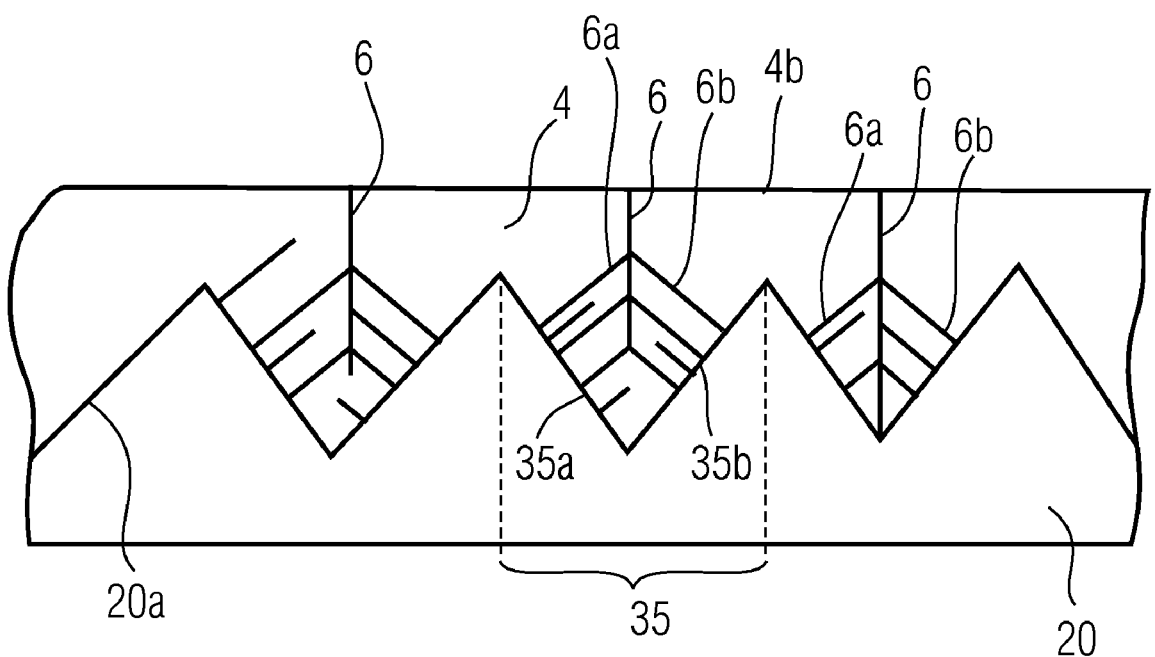
FIG. 11b shows another cross sectional view of a semiconductor structure with a gallium nitride layer on top of a silicon substrate according to another embodiment.

In FIGS. 11a and 11b, a schematic cross sectional view of a substrate 20 with adjacent structured regions 35 is depicted. At the top side 20a of the substrate, for example, a gallium nitride layer is deposited. The growth of the GaN can be controlled by the respective growth conditions. Thus, it may be possible, for example, to influence the ratio of the growth rate in direction of the c-axis and a-axis, in order to achieve a planar GaN surface. If this measure is not sufficient to achieve an adequate planar GaN surface a subsequent planarization step may be performed. Otherwise it is also possible to continue the fabrication of the semiconductor structure on an uneven GaN surface. This means, the surface of the gallium nitride layer can be planar, it can be planarized, or it may still comprise a structure dependent on the structure of the substrate 20 or the growth conditions. As described above, if the gallium nitride is formed at the different silicon flanks 35a and 35b so that the slip lines 6a, 6b from a growing gallium nitride front line can accidentally merge, new slip lines 6 may develop, which can grow vertically upwards to the top side 4d of the gallium nitride layer 4. Nevertheless the total number of slip lines may be reduced due to the merger of the slip lines 6a, 6b. As it is schematically shown in FIGS. 11a and 11b, the gallium nitride layer may be formed directly on the top side of the substrate 20 and may comprise no buffer layer between the substrate 20 and the gallium nitride layer 4. If, for example, molecular-beam-epitaxy (MBE) is used to grow the gallium nitride layer 4, a small silicon nitride layer of about 2 nm may develop between the silicon substrate and the gallium nitride layer. Alternatively, for example, metal-organic-chemical-vapor deposition-epitaxy (MOCVD) can be used to deposit the gallium nitride layer 4. In this case at least one buffer layer 8, e.g., a AN buffer layer, may be arranged between the substrate, e.g., silicon and the GaN-layer 4.

In some embodiments no buffer layer is arranged between the substrate 20 and the III-V semiconductor material layer 4. Furthermore in some embodiments, the semiconductor structure 50 does not comprise a sawing frame 50b. According to other embodiments, a sawing frame region 50b or a lattice stress compensation region 50b may surround an active semiconductor device area 50a, which comprises adjacent structured regions 35.

Figure 12A:
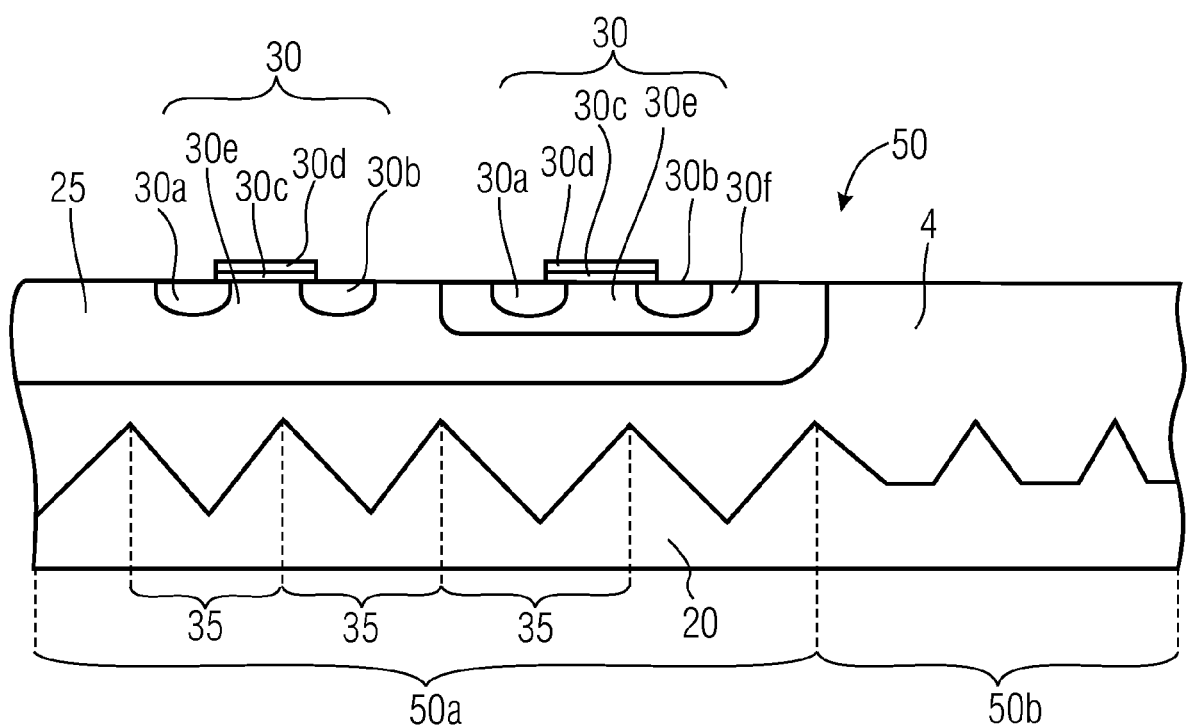
FIG. 12a shows a schematic cross sectional view of a semiconductor device structure in a semiconductor device region in a gallium nitride layer above a silicon substrate according to an embodiment.

In FIG. 12a, a further embodiment of a semiconductor structure 50 is depicted. According to some embodiments, a substrate 20 with a {100} crystal surface plane may comprise a plurality of adjacent structured regions 35 at a top side 20a of the substrate 20. The plurality of adjacent structured regions 35 may comprise adjacent substrate surfaces with {111} crystal planes. As it is depicted in FIG. 12a, the semiconductor structure 50 may furthermore comprise a gallium nitride layer 4 above the top side 20a of the substrate 20 with a semiconductor device region 25. The semiconductor device region 25 may overlap a plurality of adjacent structured regions 35. At least one semiconductor device structure 30 is formed in the semiconductor device region 25. According to some embodiments, the semiconductor device structure 30 may, for example, be a field-effect transistor (FET), e.g., a planar-FET or a vertical-metal-oxide-semiconductor (VMOS)-FET, a field-effect-transistor structure, a diode structure or a high electron mobility transistor (HEMT) or HEMT-structure or an electric circuit. The semiconductor device region 25 may also comprise other semiconductor device structures according to further embodiments. In FIG. 12a, the semiconductor device structure 30 may be a field-effect-transistor which comprises a source terminal 30a, a drain terminal 30b, a gate isolation layer 30c and a control terminal 30d. As it is known for a field-effect-transistor, a channel region 30e arranged between the source terminal 30a and the drain terminal 30b may be controllable by a voltage applied at the control terminal 30d. Depending on a doping of the respective gallium nitride layer 4, the semiconductor device structure 30 may be a p- or an n-channel transistor. The semiconductor device region 25 may comprise p- or n-doped zones 30f. Hence, a n- or p-channel transistor may be formed. In general the semiconductor device region 25 may comprise n-type doped and/or p-type doped III-V semiconductor material zones, for example, n-type doped or p-type GaN layer zones.

Figure 12B:
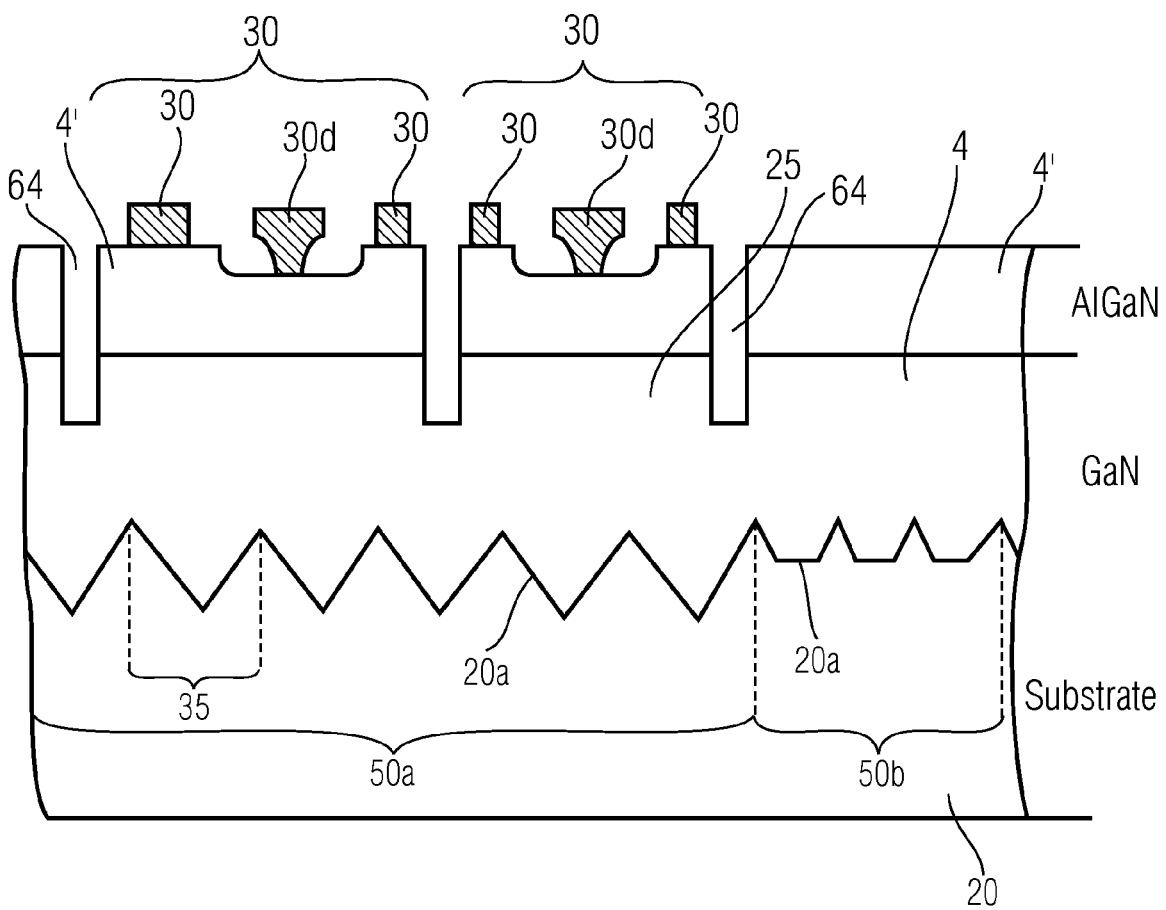
FIG. 12b shows a schematic cross sectional view of a high electron mobility transistor (HEMT) semiconductor device structure according to an embodiment.

FIG. 12b depicts the schematic cross sectional view of a high-electron-mobility-transistor (HEMT) semiconductor device structure 30 according to an embodiment. According to this embodiment the top surface 20a of a substrate 20 can be structured as described herein and a GaN-layer 4 can be grown on top of the surface 20a of the substrate 20 as described herein. Above the GaN-layer a further layer, for example, a AlGaN-layer 4' can be grown. Thus, instead of forming a channel of a transistor with doped regions, as is generally the case for MOSFETS, a junction is formed between two materials, e.g., the GaN-layer 4 and AlGaN-layer 4', with different band gaps, i.e., a hetero junction is formed, which acts as channel. Thus, a HEMT semiconductor structure can be formed. The HEMT structures 30 in the semiconductor device region 25 further comprise source contacts 30a, gate or control contacts 30d and drain contacts 30b. The contacts 30a, 30b and 30c may comprise metal or another conductive material like poly-silicon. Each of the HEMT structures 30 may be electrical separated 64 or isolated to each other. Additional layers between the GaN-layer 4 and the AlGaN-layer 4', the AlGaN-layer and the metal or the substrate and the GaN-layer can be interjacent arranged, but are not shown in FIG. 12b.

Figure 13:
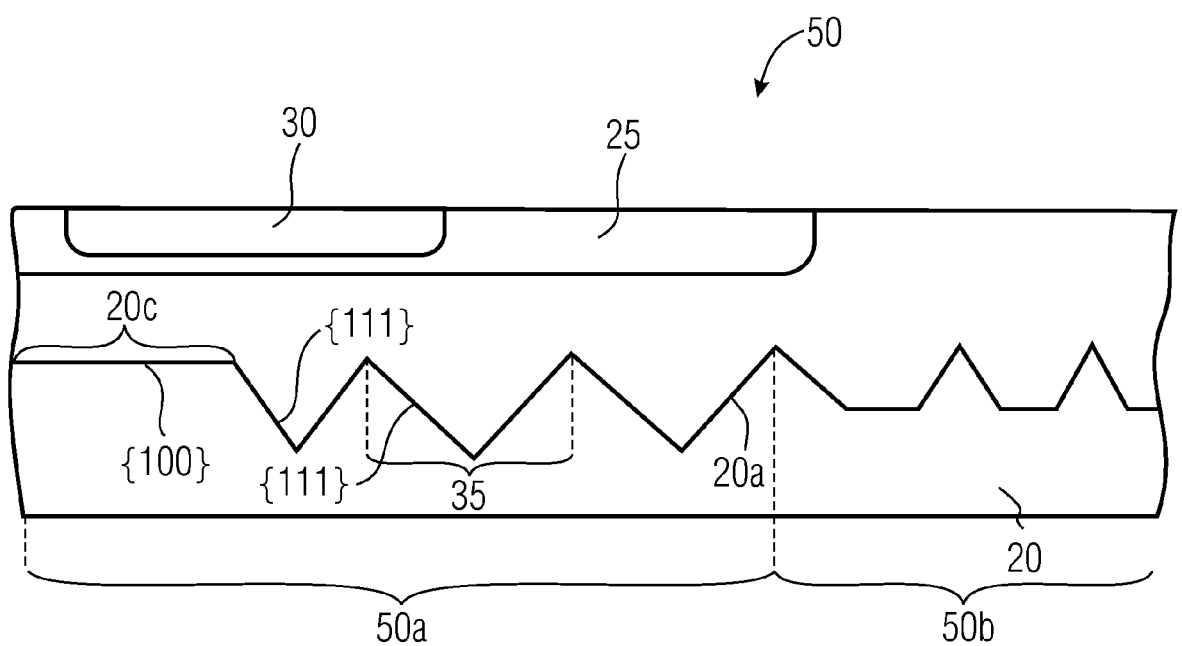
FIG. 13 shows a schematic cross sectional view of a semiconductor structure of a semiconductor device region partly overlapping a silicon substrate comprising {100} crystal surfaces and partly overlapping {111} crystal surface planes of the substrate according to an embodiment.

In FIG. 13, the schematic cross sectional view of a semiconductor structure 50 according to another embodiment is depicted. In this embodiment, the top side 20a of the substrate 20 may still comprise some surface regions 20c with a {100} crystal surface plane. According to this embodiment, the III-V semiconductor material layer, for example, the gallium nitride layer 4 may be formed above the top side 20a of the substrate 20. The semiconductor device region 25 may extend in this embodiment above the substrate surface region 20c with the {100} crystal plane. Hence, in this embodiment, the semiconductor device structure 30 may partially overlap the adjacent structured regions 35 and partially overlap the substrate surface region 20c with the {100} crystal surface plane. This means, that a semiconductor device structure 30 may be formed partially above an area of the substrate with a {100} crystal surface plane and partially above an area of a substrate 20 which comprises the adjacent structured regions 35 with {111} crystal planes. In some embodiments, the semiconductor structure 50 may also comprise a sawing frame region 50b as described above. In other embodiments, the semiconductor structure does not comprise such a sawing frame region 50b.

Figure 14:
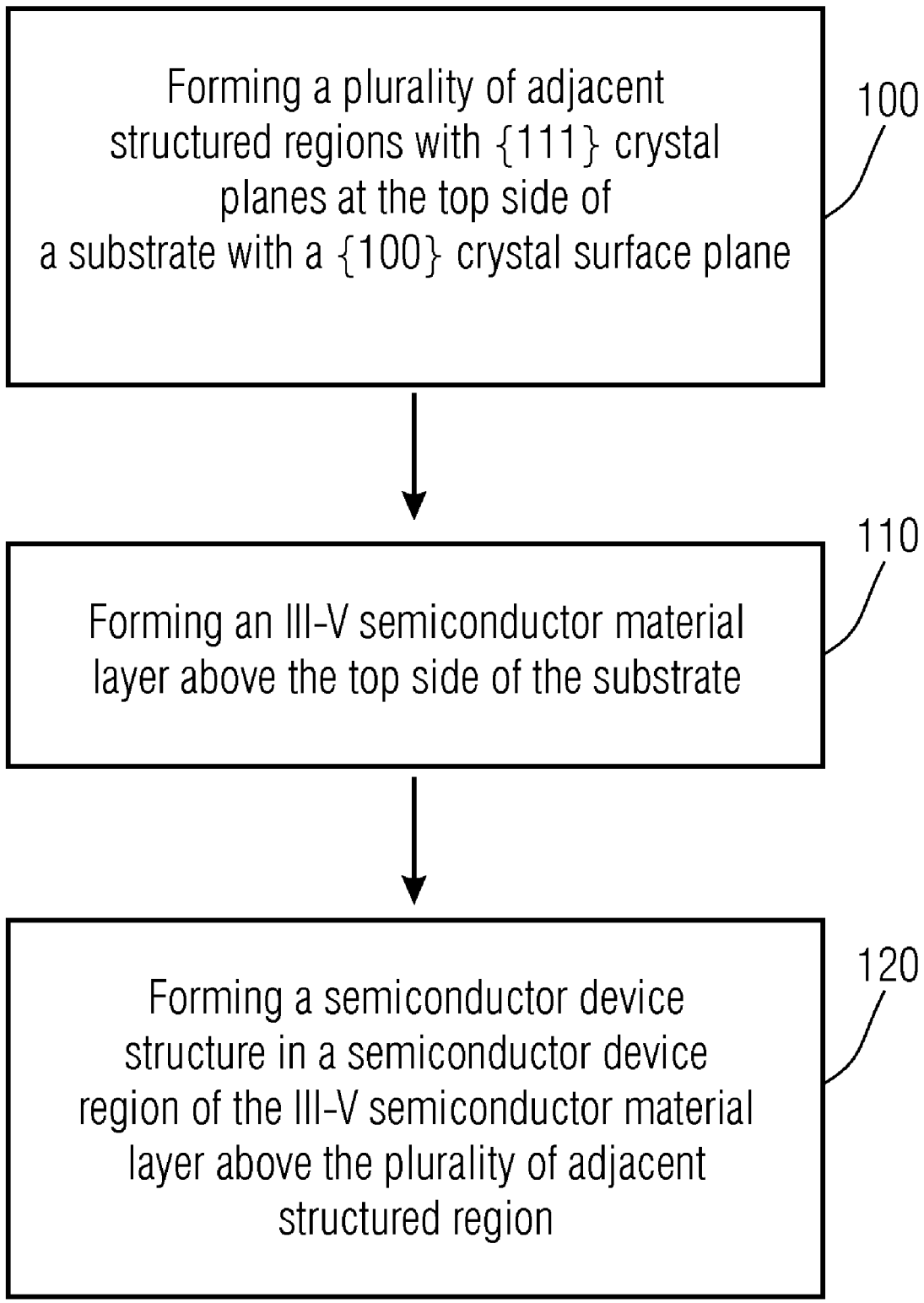
FIG. 14 shows a flow chart of the method of forming a semiconductor structure according to an embodiment.

In FIG. 14, a flow chart for the method of forming a semiconductor structure according to an embodiment is shown. The method comprises forming 100 a plurality of adjacent structured regions at the top side of a substrate with a {100} crystal surface plane, wherein the plurality of adjacent structured regions comprise adjacent substrate surfaces with {111} crystal planes. According to this embodiment, the method furthermore comprises forming 110 a III-V semiconductor material layer above the top side of the substrate. The III-V semiconductor material layer, for example, a gallium nitride layer, may be formed at least above the adjacent structured regions. The method may furthermore comprise forming 120 a semiconductor device structure in a semiconductor device region of the III-V semiconductor material layer, wherein the semiconductor device region is at least partially arranged above the plurality of adjacent structured regions.

Figure 15:
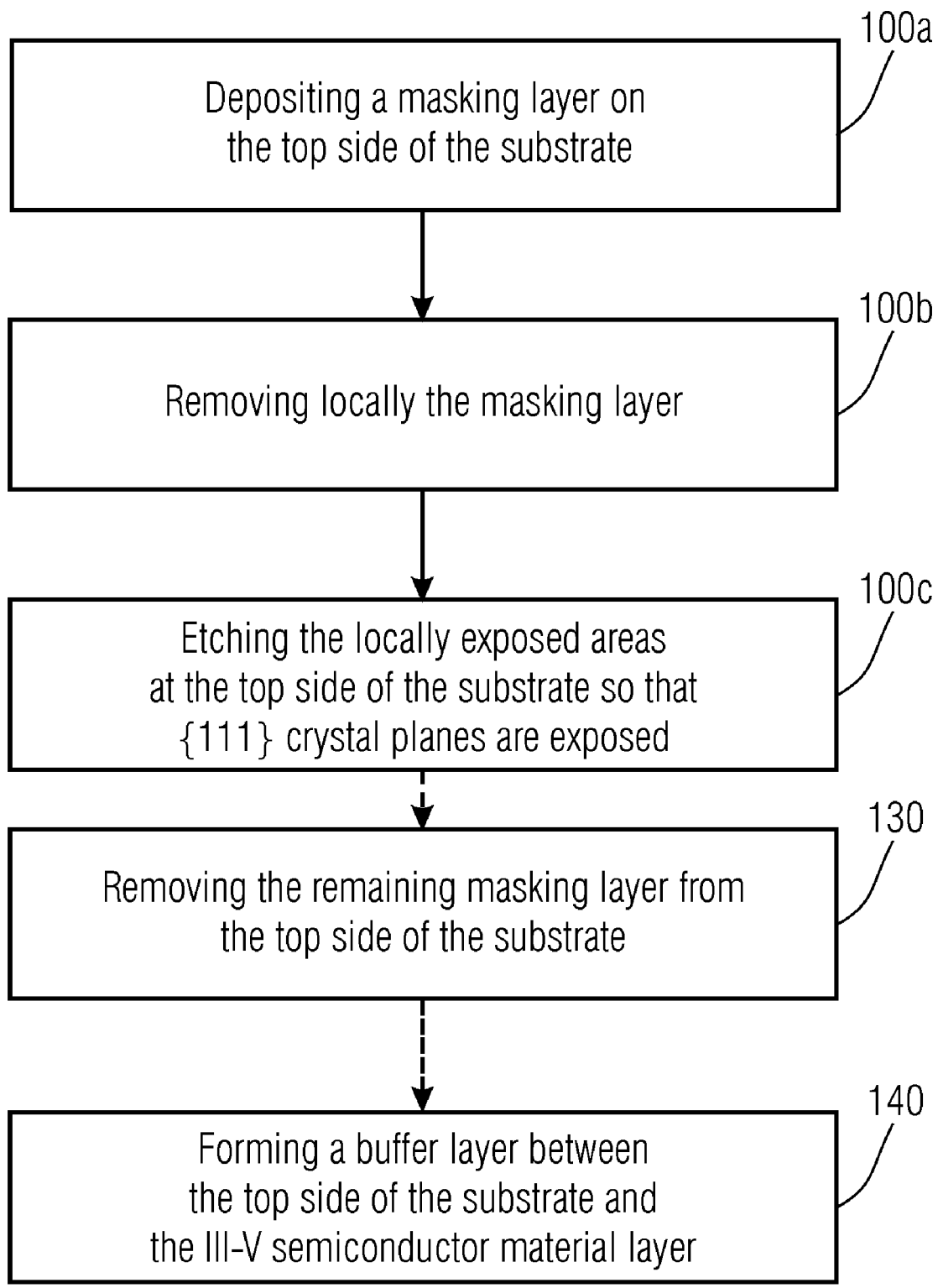
FIG. 15 shows another flow chart of the method of forming a semiconductor structure according to another embodiment.

According to some embodiments, in FIG. 15, forming 100 a plurality of adjacent structured regions with {111} crystal planes at a top side of a substrate, with a {100} crystal surface plane, may comprise depositing 100a a masking layer on the top side of the substrate, removing 100b locally the masking layer from the top side of the substrate so that the top side of the substrate with the {100} crystal surface plane is locally exposed and etching 100c the locally-exposed top side of the substrate so that the plurality of adjacent structured regions, which comprise adjacent substrate surfaces with {111} crystal planes are formed.

According to other embodiments, the method may furthermore comprise after etching 100c the locally exposed areas, removing 130 the remaining masking layer from the top side of the substrate. In addition, the method may comprise forming 140 one or more buffer layers between the top side of the substrate and the III-V semiconductor material layer.

Forming 100 a plurality of adjacent structured regions may further comprise forming a sawing frame region surrounding the plurality of adjacent structured regions. The forming of the sawing frame region may be performed so that the sawing frame region comprises substrate surfaces with crystal planes different from {111} crystal planes or with {111} crystal planes which are different with respect to the size or arrangement to the {111} crystal planes of the plurality of adjacent structured regions 35 in the active device region 50a of the substrate 50. Furthermore the forming of the sawing frame region may be performed so that in a subsequent growth of a crystalline III-V semiconductor material layer a higher number of slip lines or higher crystal lattice defect density are created in the sawing frame region 50b than in an active semiconductor region 50a or the semiconductor device region 25 of the semiconductor structure 50 are created. In order to achieve this, the masking layer above the sawing frame region may be structured so that a subsequent crystal growth of a III-V semiconductor material layer results in a higher crystal lattice defect density.

According to another aspect, the method may furthermore comprise removing the substrate below the semiconductor device structure. This may be performed, for example, by chemical mechanical polishing (CMP). According to this embodiment, a semiconductor structure can be fabricated, which comprises a gallium nitride layer with a high quality layer at least in some regions of the wafer and wherein the substrate on which the gallium nitride layer is grown has been removed.

Forming of an III-V semiconductor material above the top side of the substrate may be performed as described above and the method may result in a strongly reduced number of crystal lattice defects or slip lines in the semiconductor material layer above the adjacent structured regions 35 (see FIG. 3) with {111} crystal planes.

According to another aspect, the slip lines may be accumulated at certain areas of the III-V semiconductor material layer. As it is described in context to FIGS. 9 and 10, most of the slip lines may be accumulated in the valleys of the structured regions 35. According to the embodiment, which is in context to FIG. 8 as described, the slip lines may be accumulated above the tips 35d of the structured regions 35 in the substrate or above the respective valley. If the slip lines or crystal lattice defects in the III-V semiconductor material are accumulated at certain areas, then it may be possible to isolate these slip lines by depositing an insulating material on these areas and by excluding these areas from further processing. Furthermore, a polishing of these areas, for example, by means of a chemical mechanical polishing may be performed.

According to embodiments, a III-V semiconductor material layer, for example, a gallium nitride layer can be grown on wafers or substrates with a {100} crystal orientation. The III-V semiconductor material layer may comprise a sufficient crystal quality to produce different types of semiconductor device structures in the layer, e.g., transistor structures, field effect transistor structures or diode structures. According to one aspect, the complete wafer may be structured so that the top side surface of the wafer, which may be a (100) wafer exclusively comprises (111) surfaces.

According to another aspect, an intended mechanical stress or lattice stress reduction in a sawing frame of a III-V semiconductor material layer can be achieved if the structuring of a mask layer 38 is performed so that in a subsequent III-V material layer growth a high number of slip lines or crystal lattice defects is developed in the sawing frame region 50b. A high number of defects can cause a reduced mechanical stress, a reduced crystal lattice tension or compression strength in the semiconductor structure. In contrast a low density of lattice defects causes a high mechanical stress. In order to achieve this, the structuring of the sawing frame can be performed on purpose so that in the sawing frame region, lattice defects are provoked. These provoked lattice defects can cause the reduction of mechanical stress in the III-V semiconductor material layer.

According to another embodiment, a semiconductor structure may be formed comprising alignment marks. The forming of the alignment marks may be done without performing additional process steps during the fabrication process of the semiconductor structure. The use of Si(100)-substrates ensures a high compatibility to already established semiconductor processes. By preparing a substrate in a way as described therein, more possibilities to decrease the slip line density in a hereupon grown semiconductor material layer are available compared to a conventional ELOG method. Furthermore the local accumulation of slip lines at predetermined locations, for example, in the valleys or at the tips of a gallium nitride layer is possible. These slip lines may be easy to exclude, e.g., by covering the respective areas with an insulating layer, for example, with silicon oxide.

According to another aspect, large semiconductor device regions in an III-V semiconductor material layer, e.g., gallium nitride can be fabricated with the method. These device regions may be larger than semiconductor device regions, which are fabricated in a conventional ELOG technique. The semiconductor device region may comprise a crystal lattice quality which is sufficient to fabricate semiconductor devices.

In other embodiments, the material of the substrate 20 and the III-V semiconductor material 4 may comprise a coincidence site lattice.

According to another aspect of the invention a further problem of a GaN epitaxial layer growth on silicon can be solved or diminished. Due to the different coefficients of thermal expansion of Si(~2.6 $10^{-6}$/K) and GaN (~5.6-6.2 $10^{-6}$/K) and a high deposition temperature during the MOCVD, e.g., between 800° C. and 1200° C., for example at about 1000° C., a high lattice stress and as a consequence cracks may develop while the Si/GaN hetero-structure is cooling. This lattice stress, and hence the cracks may be avoided if the substrate is manufactured so that it comprises, as described above, sawing frames regions 50b or lattice stress compensation regions 50b with a higher density of defects or slip lines so that a reduction of the lattice stress takes place in the sawing frame region instead of the active semiconductor device region. These lattice stress compensation regions 50b which may comprise a higher density of defects or slip lines may be used to initiate the formation of defects which can be necessary, because of the characteristics of the deposited semiconductor material, in a region which is not relevant for the performance of the semiconductor structure. The defect density in a sawing frame region 50b or a lattice stress compensation region 50b may be optimized to reduce the lattice stress and hence, the probability that a crack develops while manufacturing a semiconductor structure 50. The lattice stress compensation regions 50b can be etched so that they surround or enclose an active semiconductor structure area. The substrate and the III-V material layer may be mutually decoupled with respect to lattice stress by means of the lattice stress compensation region 50b.

According to another embodiment the method of forming a semiconductor structure may comprise forming a lattice stress compensation structure by creating lattice stress compensation regions 50b which comprise a higher crystal lattice defect density than an active device region 50a of the semiconductor structure. This can be achieved as described herein. According to other embodiments of the method of forming a semiconductor structure the forming of the III-V semiconductor material layer can be performed so that the III-V semiconductor material layer comprises a thickness up to 50 µm, for example, a thickness between 1 nm and 50 µm, between 100 nm and 10 µm or between 500 nm and 5 µm. This can be achieved by usage of the lattice stress compensation regions, so that crack free III-V semiconductor material layers can be grown with a higher thickness than III-V semiconductor material layers without having lattice stress compensation regions 50b.

Therefore in some embodiments a semiconductor structure 50 may comprise lattice stress compensation regions 50b, which are configured to reduce lattice stress due to a crystal lattice mismatch between the substrate and a III-V material layer in the semiconductor structure. Such a semiconductor structure with a lattice stress compensation region 50b may comprise a III-V semiconductor material layer with a thickness, for example, up to 50 µm, for example, with a thickness between 1 nm and 50 µm, between 100 nm and 10 µm or between 500 nm and 5 µm. The III-V semiconductor material layer may be a crack free layer, which does not comprise a crack.

With this structuring it might also be possible to create substrates with high stress in the active area, since stress relaxation can be done in the stress compensation region 50b.

While this invention has been described in terms of several embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations and equivalents as falling within the true spirit and scope of the present invention.

What is claimed is:

1. A semiconductor structure comprising:
   a substrate with a {100} crystal surface plane comprising a plurality of adjacent structured regions at a top side of the substrate, wherein the plurality of adjacent structured regions comprise adjacent substrate surfaces with {111} crystal planes; and
   a III-V semiconductor material layer above the top side of the substrate with a semiconductor device region, which comprises at least one semiconductor device structure, wherein the semiconductor device region is arranged above the plurality of adjacent structured regions at the top side of the substrate; and
   a sawing frame region surrounding the plurality of adjacent structured regions, wherein the sawing frame region comprises a plurality of adjacent structured regions having adjacent substrate surfaces with {111} crystal planes and substrate surfaces with crystal planes different from {111} crystal planes.

2. The semiconductor structure according to claim 1, wherein the plurality of adjacent structured regions comprise exclusively adjacent substrate surfaces with {111} crystal planes.

3. The semiconductor structure according to claim 1, wherein the adjacent substrate surfaces with {111} crystal planes form trench structures.

4. The semiconductor structure according to claim 1, further comprising a buffer layer, arranged between the substrate and the III-V semiconductor material layer.

5. The semiconductor structure according to claim 4, wherein the buffer layer and the substrate comprise less crystal lattice mismatch than the III-V semiconductor material layer and the substrate.

6. The semiconductor structure according to claim 1, wherein a material of the substrate and a material of the III-V semiconductor material layer comprise a coincidence site lattice.

7. The semiconductor structure according to claim 1, wherein the III-V semiconductor material layer comprises gallium nitride (GaN).

8. The semiconductor structure according to claim 1, wherein the at least one semiconductor device structure is a field-effect transistor (FET) structure, a high electron mobility transistor (HEMT) structure, a diode structure or an electric circuit.

9. The semiconductor structure according to claim 1, wherein a first region of the III-V semiconductor material layer which overlaps the plurality of adjacent structured regions, comprises a lower crystal defect density than a second region of the III-V semiconductor material layer, which overlaps the sawing frame region.

10. The semiconductor structure according to claim 1, wherein a first region of the III-V semiconductor material layer, which overlaps the plurality of adjacent structured regions, comprises a higher crystal lattice tension or crystal lattice compression strength than a second region of the III-V semiconductor material layer, which overlaps the sawing frame region.

11. The semiconductor structure according to claim 1, wherein the III-V semiconductor material layer further comprises alignment marks.

12. The semiconductor structure according to claim 1, wherein the substrate further comprises lattice stress compensation regions and the III-V semiconductor material layer comprises a thickness between 1 nm and 50 µm.

13. A method of forming the semiconductor structure of claim 1, the method comprising:
   forming the plurality of adjacent structured regions at the top side of the substrate;
   forming the III-V semiconductor material layer above the top side of the substrate; and
   forming the at least one semiconductor device structure in the semiconductor device region of the III-V semiconductor material layer.

14. The method according to claim 13, wherein forming of the plurality of adjacent structured regions comprises depositing a masking layer at the top side of the substrate, removing locally the masking layer from the top side of the substrate, so that the top side of the substrate with the {100} crystal surface plane is locally exposed and etching the locally exposed top side of the substrate, so that the plurality of adjacent structured regions which comprise the adjacent substrate surfaces with {111} crystal planes are formed.

15. The method according to claim 13, further comprising arranging a buffer layer between the top side of the substrate and the III-V semiconductor material layer.

16. The method according to claim 13, wherein the forming of the III-V semiconductor material layer comprises performing an epitaxial growth of the III-V semiconductor material layer.

17. The method according to claim 13, wherein forming the plurality of adjacent structured regions, further comprises forming the sawing frame region surrounding the plurality of adjacent structured regions.

18. The method according to claim 17, wherein forming the sawing frame region is performed, so that the sawing frame region comprises substrate surfaces with crystal planes different from {111} crystal planes.

19. The method according to claim 17, wherein forming the III-V semiconductor material layer is performed so that a first region, which is formed above the plurality of adjacent structured regions, comprises a lower crystal defect density than a second region, which is formed above the sawing frame region.

20. The method according to claim 13, further comprising removing the substrate below the semiconductor device structure.

21. The method according to claim 13, wherein forming the plurality of adjacent structured regions further comprises forming a lattice stress compensation region and wherein the III-V semiconductor material layer is formed so that the III-V semiconductor material layer comprises a thickness between 1 nm and 50 μm.

22. The method according to claim 13, wherein forming the plurality of structured regions and/or forming the III-V semiconductor material layer is performed so that an alignment mark is formed comprising either a different height, or a different structure or a different defect density compared to a III-V semiconductor region adjacent the alignment mark.

23. A semiconductor structure comprising:
a substrate with a {100} crystal surface plane comprising a plurality of adjacent structured regions at a top side of the substrate, wherein the plurality of adjacent structured regions comprise adjacent substrate surfaces with {111} crystal planes;
a III-V semiconductor material layer, above the top side of the substrate with a semiconductor device region, wherein the semiconductor device region is arranged above the plurality of adjacent structured regions,
a sawing frame region surrounding the plurality of adjacent structured regions, wherein the sawing frame region comprises a plurality of adjacent structured regions having adjacent substrate surfaces with {111} crystal planes and substrate surfaces with crystal planes different from {111} crystal planes,
a buffer layer between the substrate and the III-V semiconductor material layer; and
a field-effect transistor (FET) structure, a diode structure, a high-electron-mobility transistor (HEMT) structure or an electric circuit arranged in the semiconductor device region.

* * * * *